(12) United States Patent
Yasuda et al.

(10) Patent No.: US 7,560,767 B2
(45) Date of Patent: Jul. 14, 2009

(54) NONVOLATILE SEMICONDUCTOR MEMORY DEVICE

(75) Inventors: Naoki Yasuda, Yokohama (JP); Yukie Nishikawa, Kitakyushu (JP); Koichi Muraoka, Sagamihara (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/548,914

(22) Filed: Oct. 12, 2006

(65) Prior Publication Data
US 2007/0132004 A1    Jun. 14, 2007

(30) Foreign Application Priority Data
Oct. 14, 2005 (JP) ............... 2005-300432
Sep. 28, 2006 (JP) ............... 2006-265905

(51) Int. Cl.
*H01L 29/423* (2006.01)
*H01L 29/788* (2006.01)

(52) U.S. Cl. ............... 257/316; 257/314; 257/315; 257/E29.129; 257/E29.03

(58) Field of Classification Search ............ 257/314, 257/315, 316, E29.129, E29.03
See application file for complete search history.

(56) References Cited
U.S. PATENT DOCUMENTS
6,153,470 A * 11/2000 He et al. ............... 438/257

| | | | | |
|---|---|---|---|---|
| 6,630,383 B1 * | 10/2003 | Ibok et al. | ............... | 438/264 |
| 7,338,856 B2 * | 3/2008 | Chen et al. | ............... | 438/257 |
| 7,416,927 B2 * | 8/2008 | Gottsche et al. | ............ | 438/154 |
| 7,417,236 B2 * | 8/2008 | Nakasuji et al. | ......... | 250/440.11 |
| 2003/0042527 A1 | 3/2003 | Forbes et al. | | |
| 2005/0023603 A1 | 2/2005 | Eldridge et al. | | |
| 2008/0029807 A1 * | 2/2008 | Miyazaki et al. | ............ | 257/316 |
| 2008/0233694 A1 * | 9/2008 | Li | ............... | 438/216 |

OTHER PUBLICATIONS

U.S. Appl. No. 11/433,422, filed May 15, 2006, Shoko Kukuchi.
U.S. Appl. No. 11/411,804, filed Apr. 27, 2006, Akiko Nara.
U.S. Appl. No. 11/548,914, filed Oct. 12, 2006, Yasuda, et al.
U.S. Appl. No. 11/680,945, filed Mar. 1, 2007, Yasuda.
U.S. Appl. No. 11/690,401, filed Mar. 23, 2007, Kikuchi, et al.

* cited by examiner

*Primary Examiner*—Victor A Mandala
(74) *Attorney, Agent, or Firm*—Oblon, Spivak, McClelland, Maier & Neustadt, P.C.

(57) ABSTRACT

A nonvolatile semiconductor memory device according to an example of the present invention includes source/drain diffusion layers, a first insulation film on a channel between the source/drain diffusion layers, a floating gate electrode on the first insulation film and composed of first electrically conductive layers, a second insulation film on the floating gate electrode, and a control gate electrode on the second insulation film. In the case where one first electrically conductive layer excluding a top layer is defined as a reference layer among first electrically conductive layers, a work function of the reference layer is 4.0 eV or more and work functions of the reference layer and of the first electrically conductive layers above the reference layer gradually increase as the layers are proximal to the second insulation film.

20 Claims, 20 Drawing Sheets

Column direction

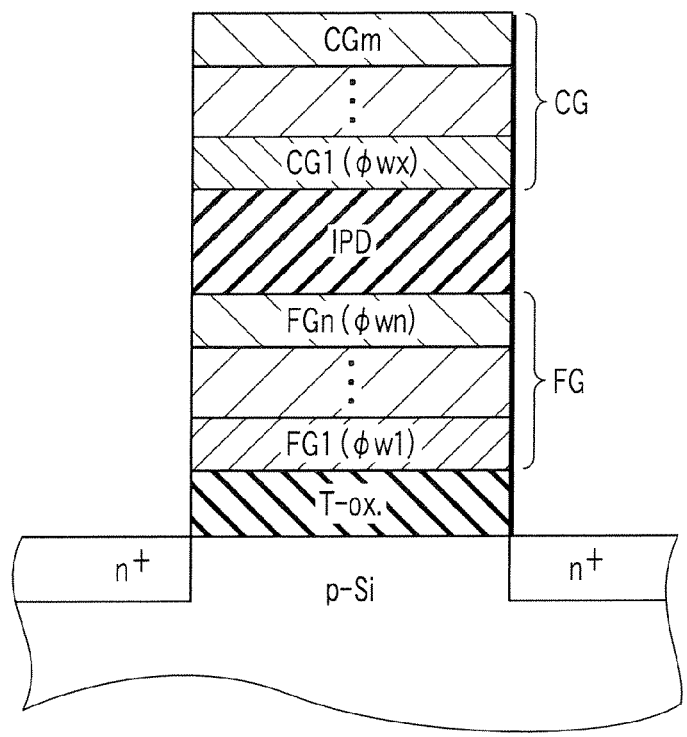
F I G. 9
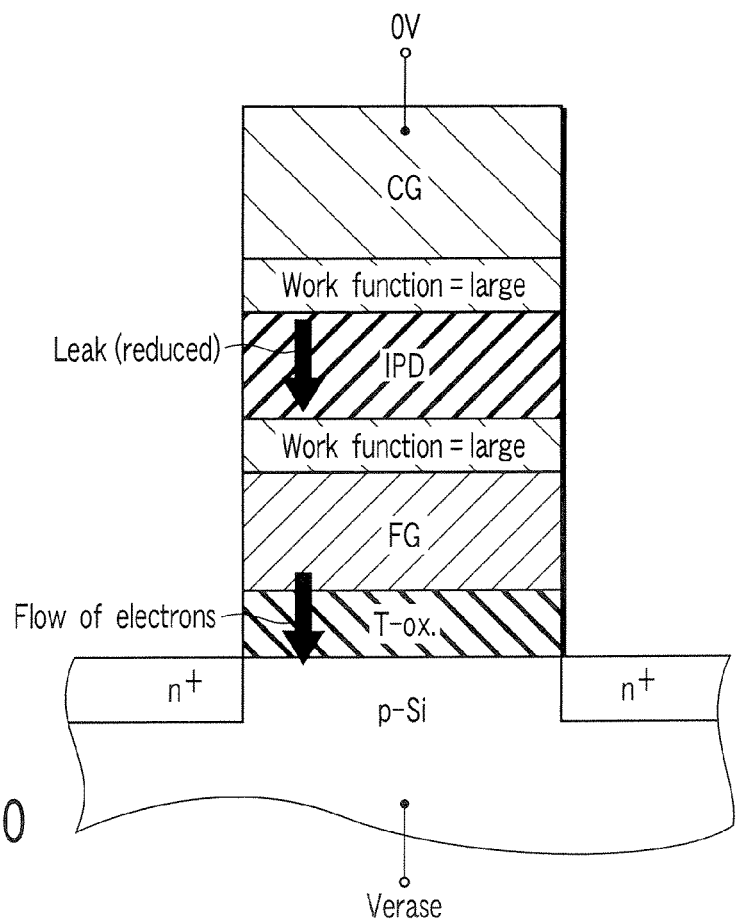
F I G. 10

NONVOLATILE SEMICONDUCTOR MEMORY DEVICE

CROSS-REFERENCE TO RELATED APPLICATIONS

This application is based upon and claims the benefit of priority from prior Japanese Patent Applications No. 2005-300432, filed Oct. 14, 2005; and No. 2006-265905, filed Sep. 28, 2006, the entire contents of both of which are incorporated herein by reference.

BACKGROUND OF THE INVENTION

1. Field of the Invention

The present invention relates to a nonvolatile semiconductor memory device having a memory cell of a stack gate structure.

2. Description of the Related Art

In a nonvolatile semiconductor memory device such as a NAND type flash memory, a memory cell (cell transistor) has a stack gate structure. The stack gate structure denotes a structure in which a floating gate electrode and a control gate electrode are stacked on a channel between a source diffusion layer and a drain diffusion layer.

The programming/erasing with respect to such a memory cell is carried out by applying a high electric field to a tunnel insulation film between a channel and the floating gate electrode, and then, exchanging an electric charge (for example, an electron) therebetween. Namely, an amount of the electric charge in the floating gate electrode is changed, thereby shifting a threshold voltage of the memory cell, and then, storing data ("0" or "1").

Here, in order to improve efficiency of the programming/erasing, it is necessary to increase a coupling ratio β of the memory cell, and further, reduce a leakage current at the time of the programming/erasing.

The coupling ratio β of the memory cell is defined by a ratio of a voltage change of the floating gate electrode to a voltage change of the control gate electrode. When this coupling ratio is expressed by a capacitance ratio, β=CIPD/Ctot is established.

In this formula, Ctot denotes a sum of capacitance between the control gate electrode and the channel, and CIPD denotes a capacitance between the control gate electrode and the floating gate electrode.

Conventionally, with respect to an increase of the coupling ratio β, such an increase has been achieved by contriving a material for an insulation film (a so called inter-poly insulation film) that is provided between the floating gate electrode and the control gate electrode. For example, an ONO ($SiO_2$/SiN/$SiO_2$) film has been used as an inter-poly insulation film.

Recently, instead of the above described ONO film, there has been actively made a research on using a material having a higher dielectric constant (high-k) than that of the ONO film as the inter-poly insulation film.

At the current stage, as a high dielectric material, there are proposed an aluminum oxide film ($Al_2O_3$), a hafnium oxide film ($HfO_2$), and a mixture or mixed crystal thereof (hafnium aluminate: $HfAlO_x$) or the like.

These materials have good compatibility with a silicon process, can cope with memory cell downsizing, and are greatly expected for its extended use in the future.

However, when such a high dielectric material is used as an inter-poly insulation film, there is a problem that a leakage current between the floating gate electrode and the control gate electrode at the time of the programming/erasing exceeds a reference value, resulting in impaired memory cell characteristics.

BRIEF SUMMARY OF THE INVENTION

A nonvolatile semiconductor memory device according to an aspect of the present invention comprises, a source/drain diffusion layer provided in a semiconductor substrate, a first insulation film provided on a channel between the source/drain diffusion layers, a floating gate electrode provided on the first insulation film and composed of stacked first electrically conductive layers, a second insulation film provided on the floating gate electrode, and a control gate electrode provided on the second insulation film, wherein, in the case where one first electrically conductive layer excluding a top layer has been defined as a reference layer from among the first electrically conductive layers, a work function of the reference layer is 4.0 eV or more, and work functions of the reference layer and of the first electrically conductive layers above the reference layer gradually increase as the layers are proximal to the second insulation film.

BRIEF DESCRIPTION OF THE SEVERAL VIEWS OF THE DRAWING

FIG. 9 is a sectional view showing an outline of an example according to the present invention;

FIG. 10 is a sectional view showing an outline of an example according to the present invention;

DETAILED DESCRIPTION OF THE INVENTION

Figure 1:
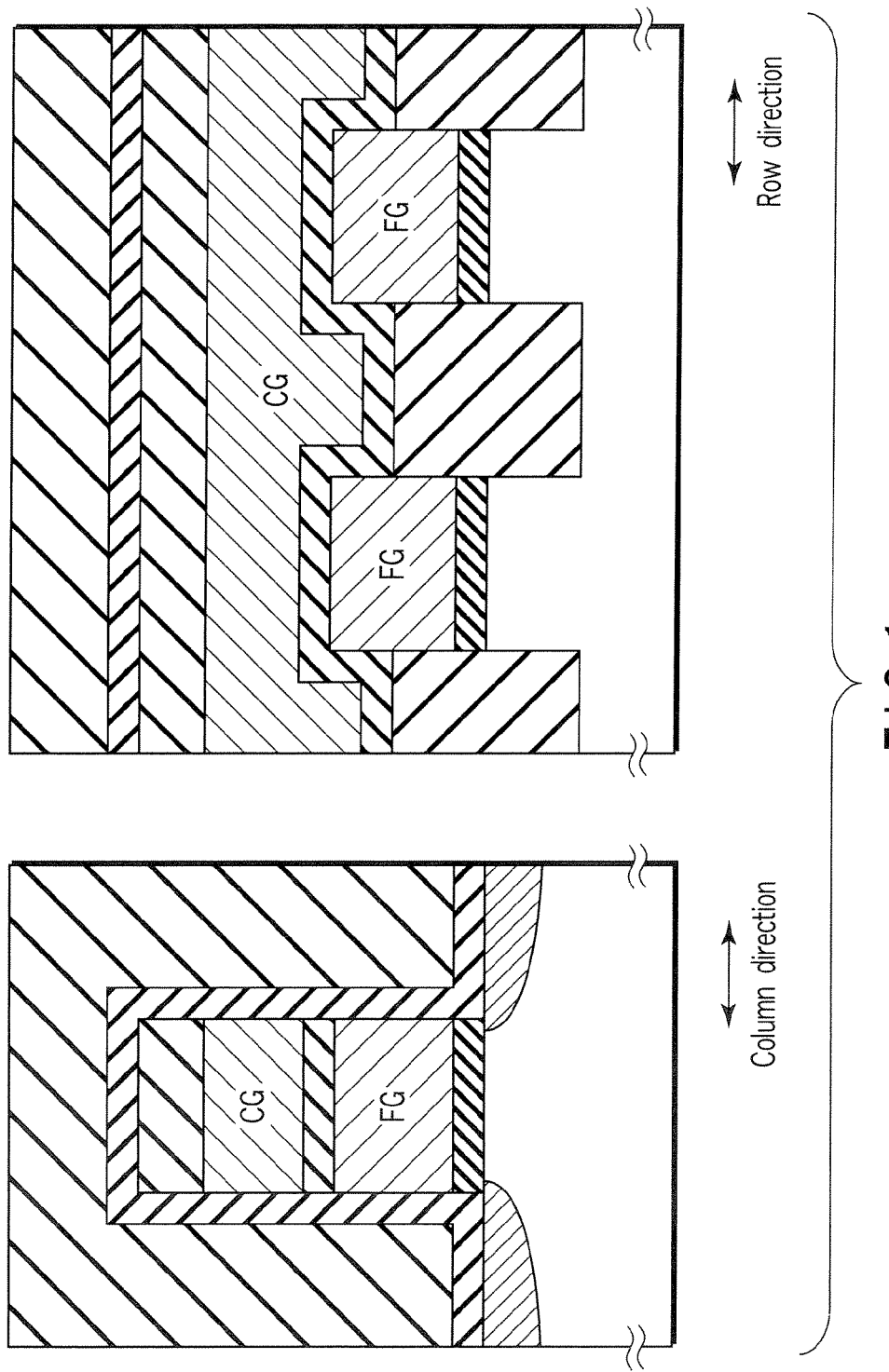
FIG. 1 is a sectional view showing a cell structure as a reference example.

A nonvolatile semiconductor memory device of an aspect of the present invention will be described below in detail with reference to the accompanying drawings.

1. Work Function

Upon explanation of an example according to the present invention, a concept of "work function" frequently appears. First, this work function will be described here.

A technique of evaluating a work function in a very small region is required to measure a work function of a material for use in each layer of a memory cell of a nonvolatile semiconductor memory device.

Here, an evaluation technique (Kelvin Probe Technique) using a Kelvin Probe Force Microscopy (KPM) that is a kind of Scanning Probe Microscopy (SPM) is defined as a technique of evaluating a work function.

In the Kelvin Probe Technique, an electric potential difference between a sample surface and a probe electrode (probe needle) is directly measured. If a work function of the probe electrode is already known, a work function of the sample surface can be precisely obtained.

In the Kelvin Probe Technique, an electric potential difference between the sample surface and the probe electrode is obtained based on the following principle.

First, the probe electrode and the sample surface are made proximal to each other, and a capacitor using both of them as electrodes is formed. Here, if the probe electrode is vibrated, the capacitance of the capacitor changes, and thus, electric charge transfer occurs. The transfer of this electric charge is detected as an alternating current.

Next, after a bias voltage has been applied to the probe electrode, if an electric potential difference between the sample surface and the probe electrode is cancelled, an electric potential at each end of the capacitor is equal to each other. Thus, no electric charge transfer occurs, and no alternating current flows.

Therefore, the work function of the sample surface can be evaluated by detecting a bias voltage whose alternating current becomes minimal.

As in the memory cell of the nonvolatile semiconductor memory device, in the case where the work function must be measured in a very small region as well, the above principle applies similarly. In this case, the measurement of the work function should be enabled if the probe electrode is downsized.

However, if the probe electrode is downsized, the alternating current is also reduced. Thus, there is a problem that a sufficient resolution cannot be obtained.

Therefore, the Kelvin Probe Force Microscopy utilizes an electrostatic power generated between the probe electrode and the sample surface instead of the alternating current.

If an electric potential difference between the probe electrode and the sample surface does not occur, no electrostatic power occurs. Therefore, the work function in the very small region can be measured by obtaining a bias voltage whose electrostatic power becomes minimal.

Such a Kelvin Probe Force Microscope (evaluation device) is actually commercially available. Thus, the measurement of the work function can be easily carried out by providing a sample such that a cross section of a memory cell of the nonvolatile semiconductor memory device can be seen.

2. Coupling Ratio

An example according to the present invention is applied to a nonvolatile semiconductor memory device having a memory cell of a stack gate structure.

In such a nonvolatile semiconductor memory device, there is first employed a technique of, even if a memory cell is downsized, increasing an area in which the surfaces of a floating gate electrode and a control gate electrode are opposed to each other, so that a coupling ratio is not lowered.

FIG. 1 shows an example of such a cell structure.

In the figure, a row direction is defined as a direction in which a word line (control gate electrode) extends and a column direction is defined as a direction orthogonal to the row direction.

This structure is featured in that part of a side face of a floating gate electrode FG is covered with a control gate electrode CG. This increases an area in which the floating gate electrode FG and the control gate electrode CG are opposed to each other and increases the coupling ratio $\beta$ of a memory cell.

However, in recent years, because the coupling ratio $\beta$ cannot be increased as expected, there has been made an attempt to increase the coupling ratio $\beta$ by using a material with high dielectric constant (high-k) for an inter-poly insulation film.

In the following description, an inter-electrode insulation film provided between the floating gate electrode and the control gate electrode is generally referred to as an inter-polysilicon dielectric (IPD).

FIGS. 2 to 6 each show an example of a method for manufacturing the cell structure shown in FIG. 1 in the case where a high dielectric material has been used.

Figure 2:
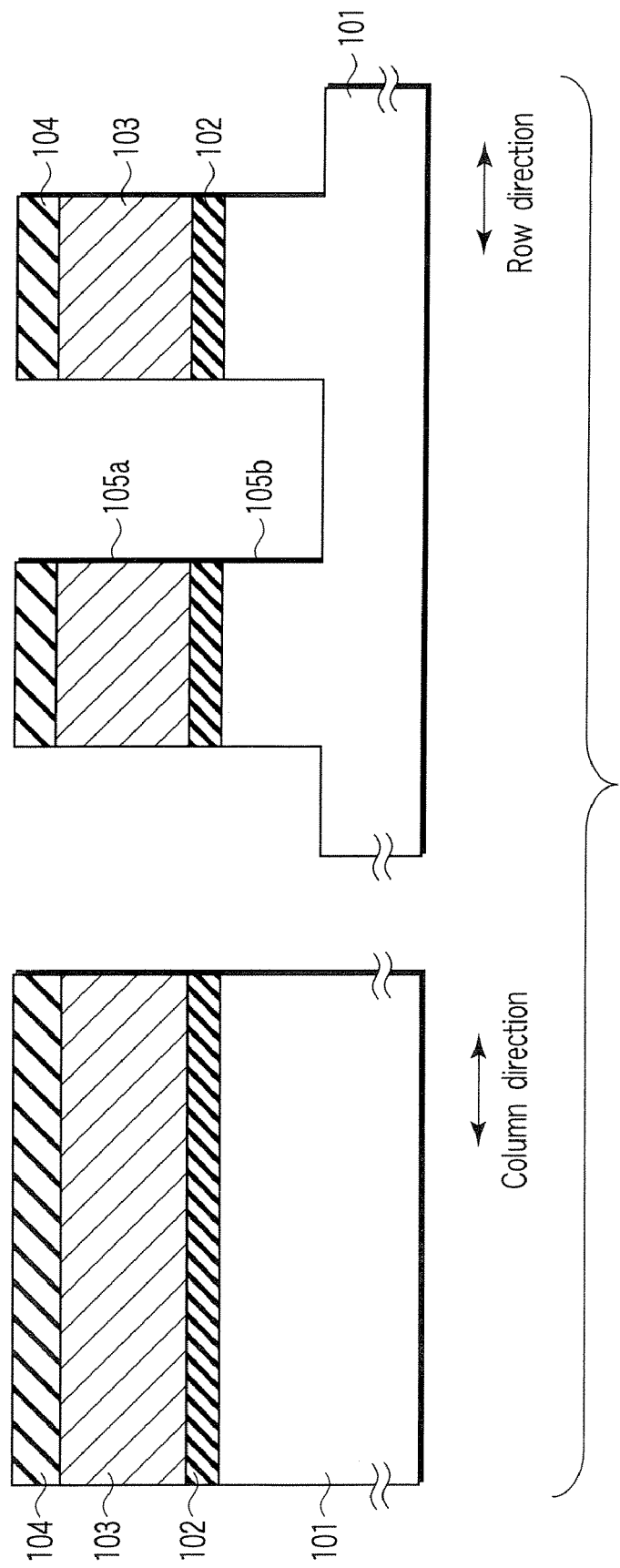
FIG. 2 is a sectional view showing a method for manufacturing the cell structure shown in FIG. 1.

First, as shown in FIG. 2, in accordance with a thermal oxidization technique, a tunnel oxide film 102 having thickness of about 7 nm to 8 nm is formed on an impurity-doped silicon substrate (including a well). In addition, in accordance with a chemical vapor deposition (CVD) technique, a phosphorus-doped polysilicon film 103 having thickness of about 60 nm and a mask material 104 for processing an element separation region are sequentially formed on the tunnel oxide film 102.

Then, a photo resist is formed on the mask material 104, and this photo resist is exposed and developed. Then, in accordance with a reactive ion etching (RIE) technique, a pattern of the photo resist is transferred onto the mask material 104. Then, the photo resist is removed.

In addition, with the mask material 104 being a mask, the polysilicon film 103 and the tunnel oxide film 102 are sequentially etched in accordance with the RIE technique, forming a slit 105a that separates the floating gate electrodes of the adjacent memory cells in the row direction from each other.

Subsequently, in accordance with the RIE technique, the silicon substrate 101 is etched, and then, an element separation trench 105b having a depth of 100 nm is formed on the silicon substrate 101.

Figure 3:
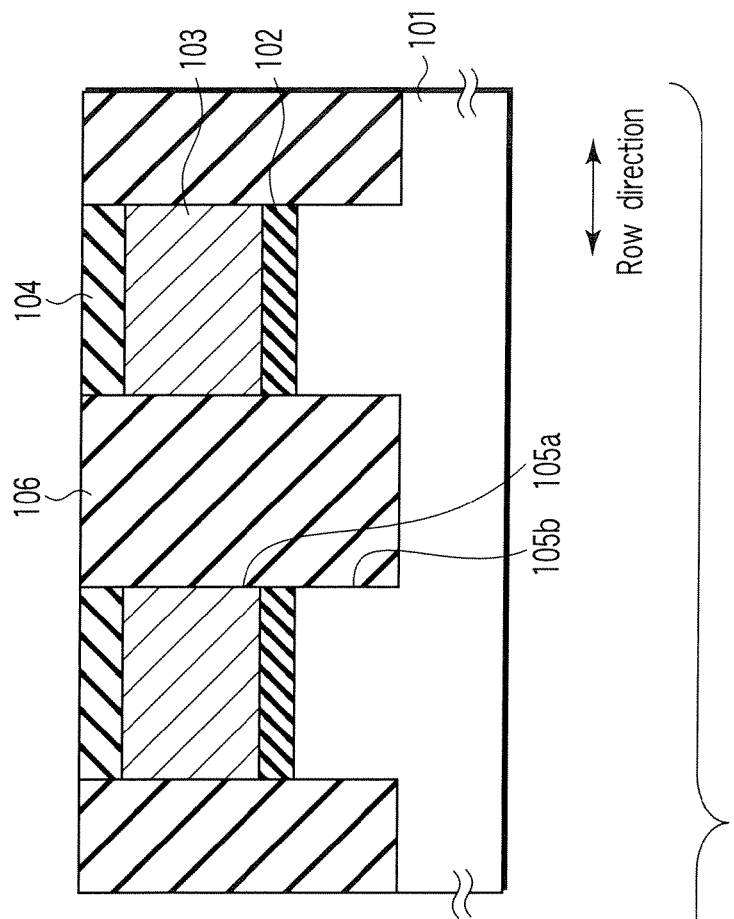
FIG. 3 is a sectional view showing a method for manufacturing the cell structure shown in FIG. 1.
Figure 3:
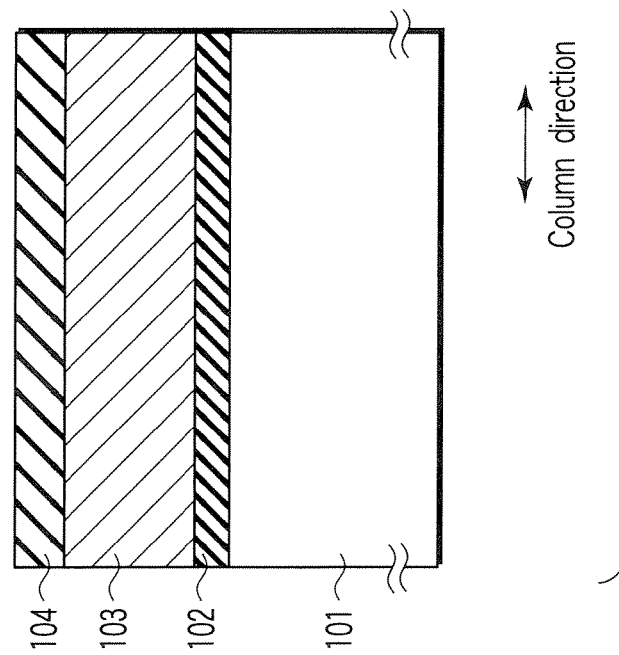

Next, as shown in FIG. 3, a silicon oxide film 106 that is completely filled in the slit 105a and the element separation trench 105b is formed in accordance with the CVD technique. In addition, in accordance with a chemical mechanical polishing (CMP) technique, the silicon oxide film 106 is polished, and then, a surface of the silicon oxide film 106 is flattened so that the mask material 104 is exposed.

Then, the mask material 104 is selectively removed.

Figure 4:
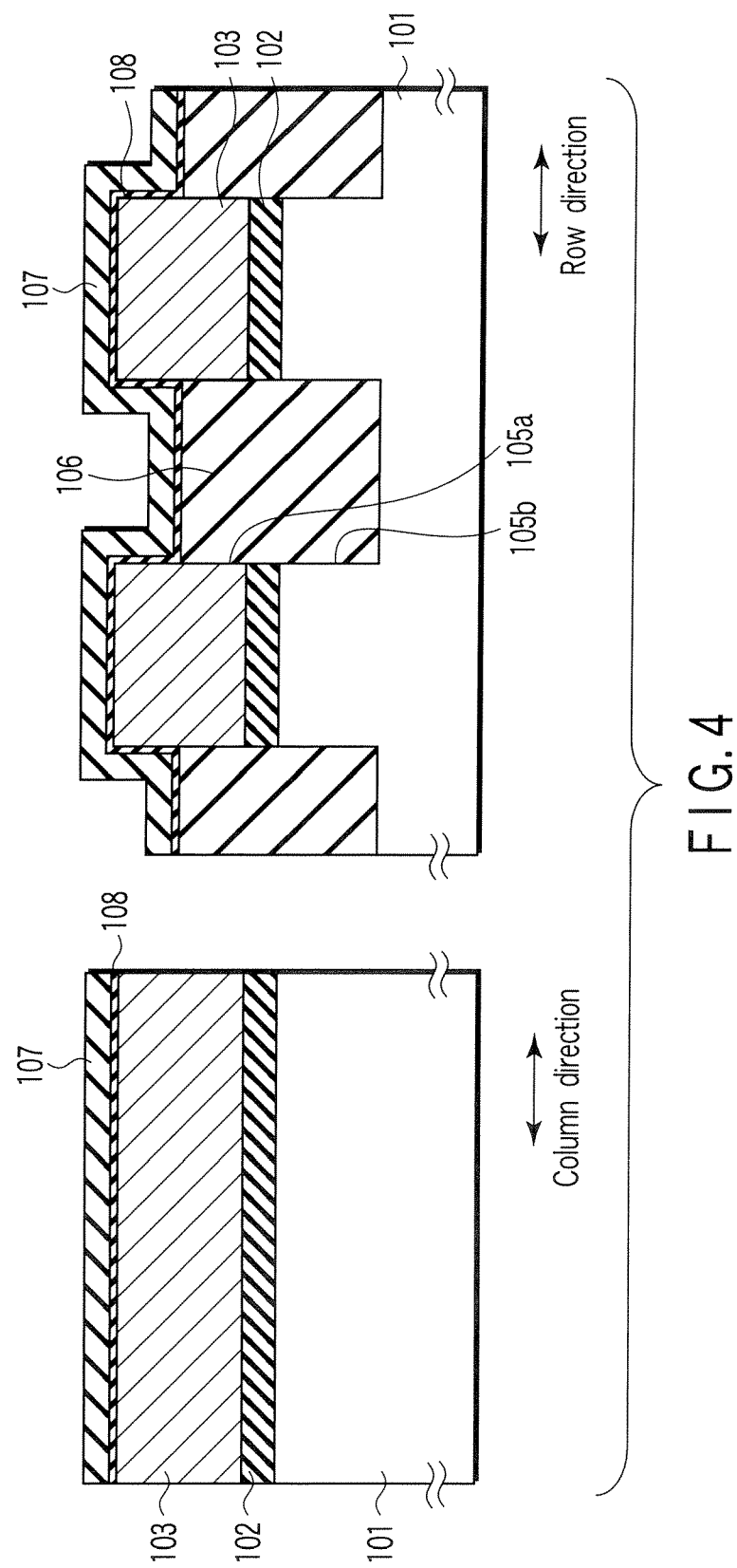
FIG. 4 is a sectional view showing a method for manufacturing the cell structure shown in FIG. 1.

Next, as shown in FIG. 4, the silicon oxide film 106 is etched back by using a diluted fluorinated acid solution, and then, part of a side face of the polysilicon film 103 is exposed.

In addition, in accordance with an atomic layer deposition (ALD) technique, an alumina film 107 having thickness of about 15 nm and covering part of the top face and the side face of the polysilicon film 103 is formed as an IPD.

At this time, due to influence of an oxidizing agent used at the time of deposition of the alumina film 107, a very thin silicon oxide film 108 is formed on an interface between the polysilicon film 103 and the alumina film 107. Therefore, the IPD is substantially provided as a two-layered structure of the alumina film 107 and the silicon oxide film 108 having a total of thickness of about 16 nm.

Figure 5:
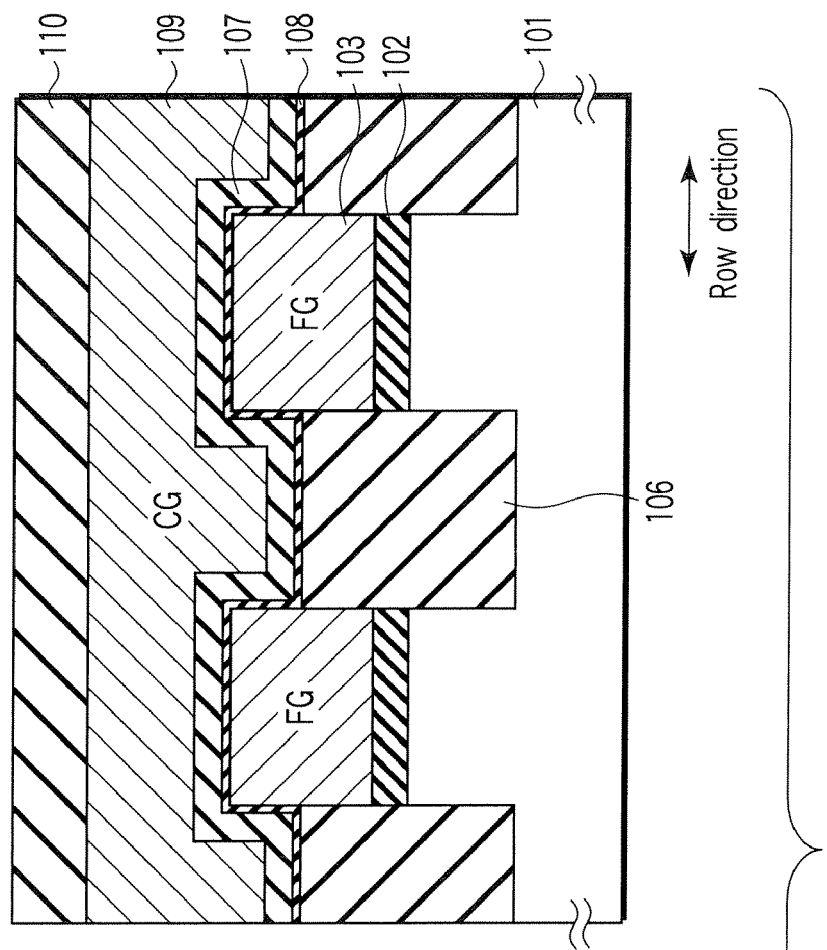
FIG. 5 is a sectional view showing a method for manufacturing the cell structure shown in FIG. 1.
Figure 5:
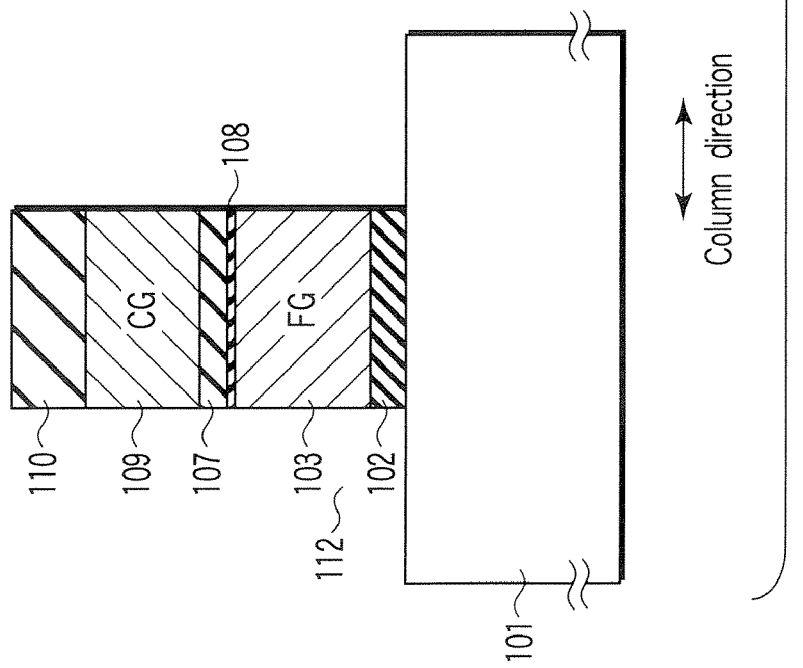

Next, as shown in FIG. 5, in accordance with the CVD technique, an electrically conductive film 109 having a total of thickness of about 100 nm made of a two-layered structure of a tungsten silicide film and a polysilicon film, for example, is formed on the alumina film 107. Subsequently, in accordance with the CVD technique, a mask material 110 is formed on the electrically conductive film 109.

Then, a photoresist is formed on the mask material 110, and this photo resist is exposed and developed. Then, in accordance with the RIE technique, a pattern of the photo resist is transferred onto the mask material 110. Then, the photo resist is removed.

Then, with the mask material being a mask, when the electrically conductive film 109, the alumina film 107, the silicon oxide film 108, the polysilicon film 103, and the tunnel oxide film 102 are sequentially etched in accordance with the RIE technique, the floating gate electrode FG and the control gate electrode CG are formed.

Figure 6:
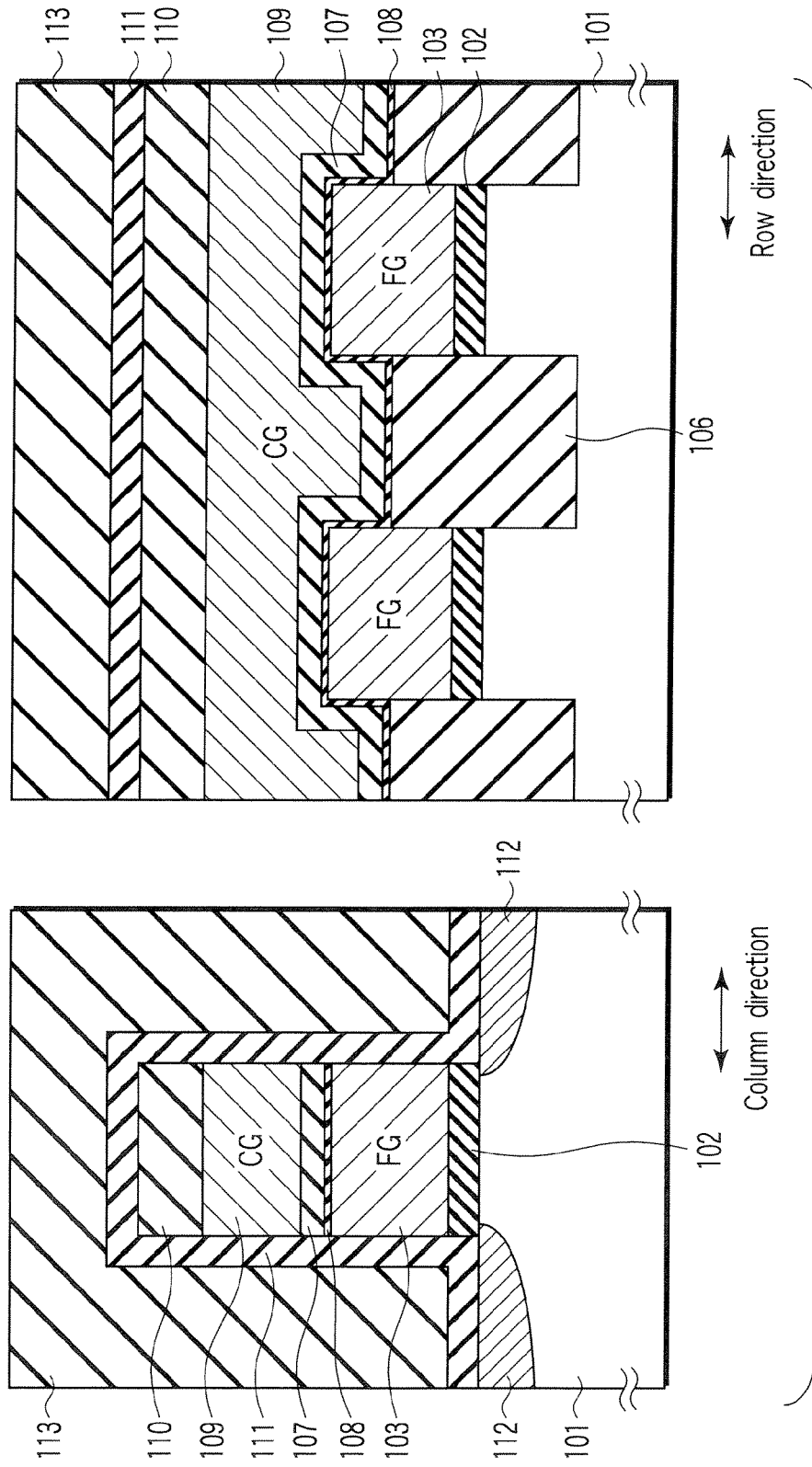
FIG. 6 is a sectional view showing a method for manufacturing the cell structure shown in FIG. 1.

Next, as shown in FIG. 6, after a process for forming a silicon oxide film 111 on a surface of the floating gate electrode FG and the control gate electrode CG has been carried out in accordance with the thermal oxidation technique, a source/drain diffusion layer 112 is formed on a surface of the silicon substrate 101 by self alignment in accordance with an ion injection technique, and a memory cell is completed.

Lastly, an inter-layered insulation film 113 for covering a memory cell is formed in accordance with the CVD technique.

In the memory cell formed in such a manufacturing method, although the coupling ratio β can be increased, a leakage current between the floating gate electrode FG and the control gate electrode CG at the time of programming/erasing exceeds a reference value required based on memory device specification, and the memory cell characteristics are impaired.

3. Outline of the Present Invention

Figure 7:
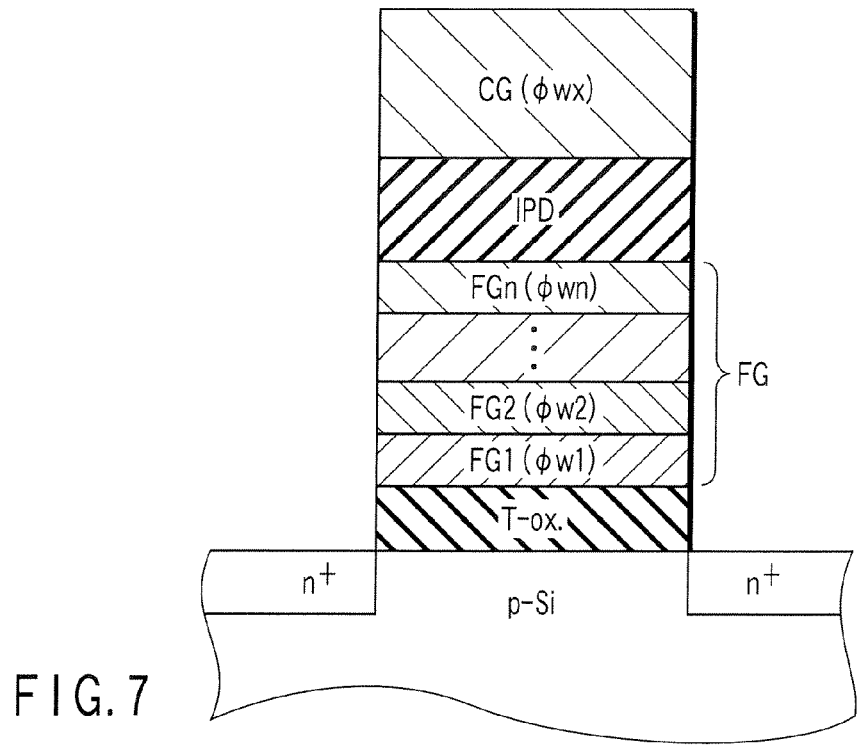
FIG. 7 is a sectional view showing an outline of an example according to the present invention.

In an example of the present invention, first, as shown in FIG. 7, a floating gate electrode FG is composed of a plurality of electrically conductive layers FG1, FG2, ... FGn, and then, one electrically conductive layer excluding a top layer is defined as a reference layer from among the plurality of electrically conductive layers FG1, FG2, ... FGn. Then, a work function of the reference layer is defined as 4.0 eV or more, and work functions of the plurality of electrically conductive layers including the reference layer are increased from the reference layer toward the IPD.

For example, in the case where the reference layer is defined as an electrically conductive layer (bottom layer) FG1, work functions $\phi w1$, $\phi w2$, ... $\phi wn$ are gradually increased from the electrically conductive layer FG1 toward the electrically conductive layer FGn.

In addition, in the case where the reference layer is defined as an electrically conductive layer FG2, work functions $\phi w1$, $\phi w2$, ... $\phi wn$ are gradually increased from the electrically conductive layer FG2 toward the electrically conductive layer FGn. In this case, the work function $\phi w1$ of the electrically conductive layer (bottom layer) FG1 may be greater than the work function $\phi w2$ of the electrically conductive layer FG2.

Here, the work function of the reference layer has been defined as 4.0 eV or more in order to eliminate an electrically conductive material having a work function that is smaller than that of silicon in the reference layer.

Figure 8:
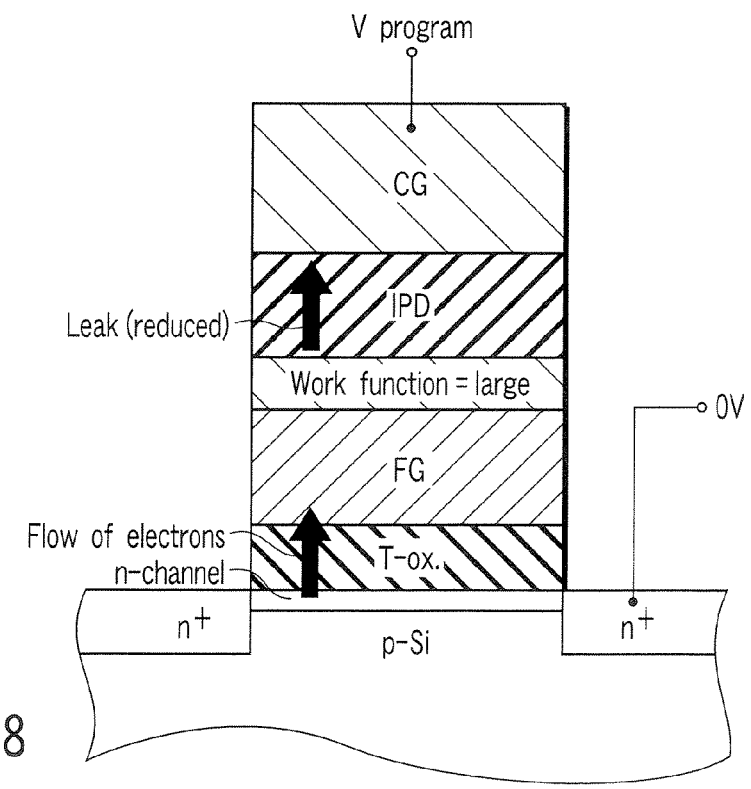
FIG. 8 is a sectional view showing an outline of an example according to the present invention.

In this manner, a leakage current that occurs with the IPD is reduced. In particular, in an example according to the present invention, as shown in FIG. 8, there is reduced a leakage current that occurs at the time of programming where an electric charge is injected into the floating gate electrode FG, i.e., a transfer of an electric charge from the floating gate electrode FG to the control gate electrode CG is reduced. This result is very effective in the case where the IPD is composed of a material with high dielectric constant (high-k).

The reference layer is composed of an electrically conductive semiconductor material or a metal including impurities, and at least one electrically conductive layer above the reference layer is composed of a metal.

The metal is defined here as material in which free electrons exist or as material whose band structure has a Fermi face. Hence, the metal can be a metal element (atoms) or any compound thereof so far as it satisfies this definition.

In addition, it is preferable that a work function $\phi wx$ of the control gate electrode CG be greater than the work function of the reference layer. For example, the control gate electrode is composed of the same material as that for the top layer of the floating gate electrode FG.

In the meantime, as shown in FIG. 9, the control gate electrode CG may be composed of a plurality of electrically conductive layers CG1, CG2, ... CGm, and the bottom layer CG1 of the control gate electrode CG may be composed of an electrically conductive material having a work function that is greater than the work function of the reference layer.

For example, the bottom layer CG1 of the control gate electrode CG is composed of the same material as that for the top layer FGn of the floating gate electrode FG.

In this case, as shown in FIG. 10, there can be reduced a unwanted phenomenon that occurs at the time of erasing where the electric charge in the floating gate electrode FG is discharged, i.e., transfer of an electric charge from the control gate electrode CG to the floating gate electrode FG is reduced.

In addition, according to an example of the present invention, it is possible to reduce the work function of the electrically conductive layer (bottom layer) FG1 of the floating gate electrode FG that comes into contact with a tunnel insulation film T-ox. In this case, a program time can be reduced because a transfer quantity of a tunnel current, i.e., an electric charge can be increased.

In addition, when the electrically conductive layer (bottom layer) FG1 of the floating gate electrode FG is composed of a metal, there does not occur a depletion layer that becomes a problem in the case where the layer is composed of polysilicon. Thus, the memory cell characteristics are improved.

In a structure according to an example of the present invention, a threshold voltage window for "0" cell/"1" cell can be increased, which is effective for multi-level operation.

4. Principle of the Present Invention

A principle of the present invention will be described here.

Hereinafter, a description will be given with respect to a case where a material with high dielectric constant (high-k) is used as an IPD, i.e. the material having a significantly reduced leakage current. However, it should be noted that an example of the present invention is not limited to a case in which the IPD is made of a high dielectric material.

When a high dielectric material is used as an IPD, a high electric field is applied to the IPD at the time of programming/erasing with respect to a memory cell, and a leakage current flow through the IPD. This leakage current deteriorates transfer of an electric charge via a tunnel insulation film (injection/discharge of an electric charge into/out of the floating gate electrode).

Therefore, it is necessary to restrict this leakage current to be equal to or smaller than a reference value defined by memory device specification.

It has been found, as a result of a variety of discussions, that the reference value is obtained as a value being about 1/10 of a current that flows through the tunnel insulation film immediately before completion of a program operation.

For example, in the case where the film thickness of a tunnel insulation film is about 7.5 nm and a coupling ratio β is about 0.6, the effective electric field applied to the IPD is obtained as about 19 M (mega) V/cm. In this case, the reference value is obtained as about $5 \times 10^{-6}$ A/cm$^2$, and the density of the allowable IPD leakage current is obtained as a value equal to or smaller than the reference value. The effective electric field can be represented by area density of electric charge divided by a dielectric constant of $SiO_2$.

Here, as the IPD, at the current stage, for example, hafnium aluminate (HfAlO$_x$) is a promising candidate. Thus, in the following description, testing is carried out using a MOS capacitor in which hafnium aluminate is used as a gate insulation film.

As a sample, the gate insulation film is made of hafnium aluminate (HfAlO$_x$) having thickness of about 20 nm, types of materials configuring the gate electrode are defined as parameters, and a negative gate voltage is applied, thereby evaluating a leakage current to voltage characteristic.

Figure 11:
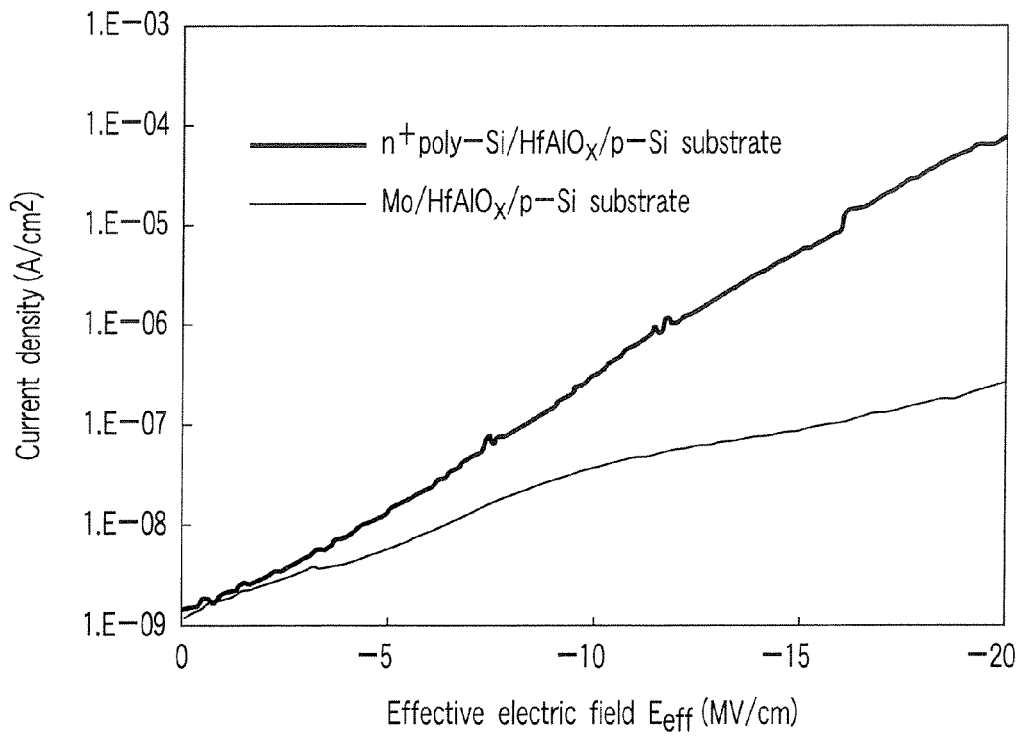
FIG. 11 is a view showing a relationship between an effective electric field and a current density.

FIG. 11 shows a leakage current to voltage characteristic as an evaluation result.

According to this result, it is found that a leakage current changes according to a work function of a gate electrode. For example, when n$^+$ type polysilicon having a work function of about 4 eV is used as a gate electrode, the leakage current density in the effective electric field 19 MV/cm is obtained as about $5 \times 10^{-5}$ A/cm$^2$.

In the case where aluminum having a work function whose value is substantially equal to that of n$^+$ type polysilicon has been used as a gate electrode as well, the substantially same result is obtained.

On the other hand, when molybdenum having a work function of less than about 5 eV is used as a gate electrode, the leakage current density in the effective electric field 19 MV/cm is obtained as about $2 \times 10^{-7}$ A/cm$^2$.

In this way, the work function of the gate electrode is greater than electron affinity of a semiconductor substrate (including a well), whereby the leakage current can be decreased, and then, the leakage current can be reduced to be equal to or smaller than a reference value required based on memory device specification.

In addition, when a leakage current to voltage characteristic has been evaluated by applying a gate voltage of positive polarity (with the other conditions being identical to the above described condition), it has been found that the leakage current density does not depend on a material configuring the gate electrode.

In this case, the leakage current density in the effective electric field 19 MV/cm is obtained as about $6 \times 10^{-5}$ A/cm$^2$ regardless of the material configuring the gate electrode.

This value becomes substantially equal to the result obtained when the gate voltage of negative polarity has been applied to the polysilicon gate electrode. In this case, there is not attained a reduction effect of a leakage current due to control of the work function of the material configuring the gate electrode.

According to the above described testing result, the work function of the gate electrode at the cathode side on which an electron is to be injected is greater than electron affinity of an electrically conductive zone of a semiconductor substrate (energy difference from bottom of conductive zone to vacuum level), whereby a leakage current flowing through an IPD (for example, material with high dielectric constant (high-k)) is reduced.

Therefore, in a nonvolatile semiconductor memory device in which programming/erasing is repeatedly carried out, it is preferable to use a material having a large work function for either of the floating gate electrode and the control electrode.

However, in the case of a NAND type flash memory, it is preferable that both of the floating electrode and the control electrode be composed of a material having a large work function.

This is because, in the NAND type flash memory, programming and erasing both are carried out by supplying an FN tunnel current to a tunnel insulation film. In addition, a leakage current reduction effect is achieved in the case where a material having a large work function exists at an IPD electron injection side (cathode side). This is because, in the NAND type flash memory, the IPD floating gate electrode side becomes the cathode side or the IPD control gate electrode side becomes the cathode side according to programming and erasing.

As described above, as an IPD, hafnium aluminate (HfAlO$_x$) whose specific dielectric constant is within the range of 15 to 30 is a promising candidate.

This is because the specific dielectric constant is properly high and compatibility with a silicon process is good.

It should be noted here that, if the IPD specific dielectric constant is too low, the leakage current reduction effect cannot be attained; and conversely, if the rate is too high, interference between the adjacent two memory cells increases.

Thus, as an IPD, a material whose specific dielectric constant is within the range of 15 to 30 as well as the above described hafnium aluminate (HfAlO$_x$) is preferred.

Such a material includes oxide, nitride, or oxynitride of a material containing at least one element selected from Al, Hf, La, Y, Ce, Ti, Zr, and Si.

In this manner, the work function of the gate electrode at the cathode side into which an electron is implanted is greater than electron affinity of an electrically conductive zone of a semiconductor substrate, whereby a leakage current flowing through an IPD is reduced.

However, it is required that the work function of the floating gate electrode is maintained at a magnitude to the extent of the electron affinity of the semiconductor substrate can be obtained.

This is because, if the work function of the floating gate electrode is large, an electric charge transfer becomes difficult, although the electric charge must be transferred from the floating gate electrode to a channel via a tunnel insulation film in order to eliminate the electric charge accumulated on the floating gate electrode.

Therefore, the floating gate electrode is formed as a stack structure made of a material having a large work function, the material being provided at the IPD side, and a material having a small work function, the material being provided at the tunnel insulation film side.

In addition, it is important to disable generation of a capacitance caused by a depletion layer at the inside of the floating gate electrode. This is because, if such a capacitance caused by the depletion layer is generated, the memory cell coupling ratio β is lowered, and the programming/erasing characteristics are degraded.

One method for preventing the generation of the capacitance due to this depletion layer is that the floating gate electrode is composed of a metal.

In addition, another method is that the floating gate electrode has a stack structure of a metal and an electrically conductive semiconductor material including dopant (impurities). The electrically conductive semiconductor material is made of a material consisting essentially of silicon, for example, silicon or a material obtained by adding germanium to silicon.

According to the latter method, the reliability of the tunnel insulation film is not degraded because a material coming into contact with the tunnel insulation film is an electrically conductive semiconductor material.

However, if a Schottky barrier is formed between the metal and the electrically conductive semiconductor material, the depletion layer spreads at the inside of the electrically conductive semiconductor material, and then, the memory cell coupling ratio β is lowered.

One idea for solving this problem is that the metal configuring the floating gate electrode is composed of a plurality of materials.

For example, the floating gate electrode is composed of: an electrically conductive semiconductor material coming into contact with a tunnel insulation film; a material having a small work function at the side of the electrically conductive semiconductor material; and a material having a large work function at the IPD side.

However, all of the plurality of materials serving as a metal is assumed to have a larger work function than that of the electrically conductive semiconductor material.

By doing this, a difference in work function generated between the electrically conductive layers in the floating gate electrode becomes large between metals each having high lattice ion density, and becomes small between the metal and the electrically conductive semiconductor material. Thus, the depletion layer in the electrically conductive semiconductor material does not extend greatly, and the memory cell coupling ratio β is not lowered.

In addition, another idea is that a work function of a metal and dopant (impurities) of an electrically conductive semiconductor material are maintained in proper relationship.

With regard to this point, when a study using a simulation has been carried out, it has been found that the lowering of the coupling ratio β can be decreased by setting the work function of the metal in the floating gate electrode at 4.4 eV or more, and then, setting the concentration of dopant (impurities) of the electrically conductive semiconductor material at $5 \times 10^{19}$ cm$^{-3}$ or more.

Simulation in this study is described below in detail.

Figure 12:
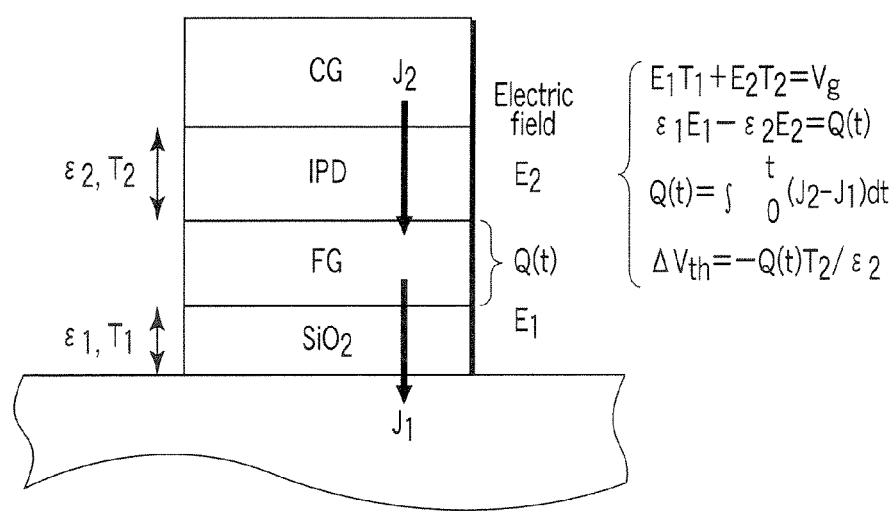
FIG. 12 is a view showing a simulation model of a change with time of a threshold voltage.

As shown in FIG. 12, assuming a one-dimensional memory cell structure, a Poisson equation and a current continuity formula are solved simultaneously, and then, a change with time of a memory cell threshold voltage is calculated.

In this calculation, it has been assumed that a Schottky barrier on an interface of a metal and polysilicon substantially increases thickness of the tunnel insulation film and that the IPD leakage current depends on the work function of the metal at the cathode electrode side.

In addition, an empirical formula of an FN (Fowler-Nordheim) tunnel current is used for a current that flows through the tunnel insulation film.

The memory cell used for this simulation is assumed to be composed of: an SiO$_2$ film having thickness of about 7.5 nm on a p-type silicon substrate; a floating gate electrode thereon; an IPD (ex. HfAlO$_x$) having thickness of about 25 nm and a specific dielectric constant of about 20 thereon; and a control gate electrode thereon.

The coupling ratio β caused by this structure is 0.6. This memory cell structure is generally provided as a device conforming to a 55 nm scaling rule or later.

With respect to this memory cell structure, a change with time of a threshold voltage is calculated in the case where 19V has been applied as a control gate voltage.

Figure 13:
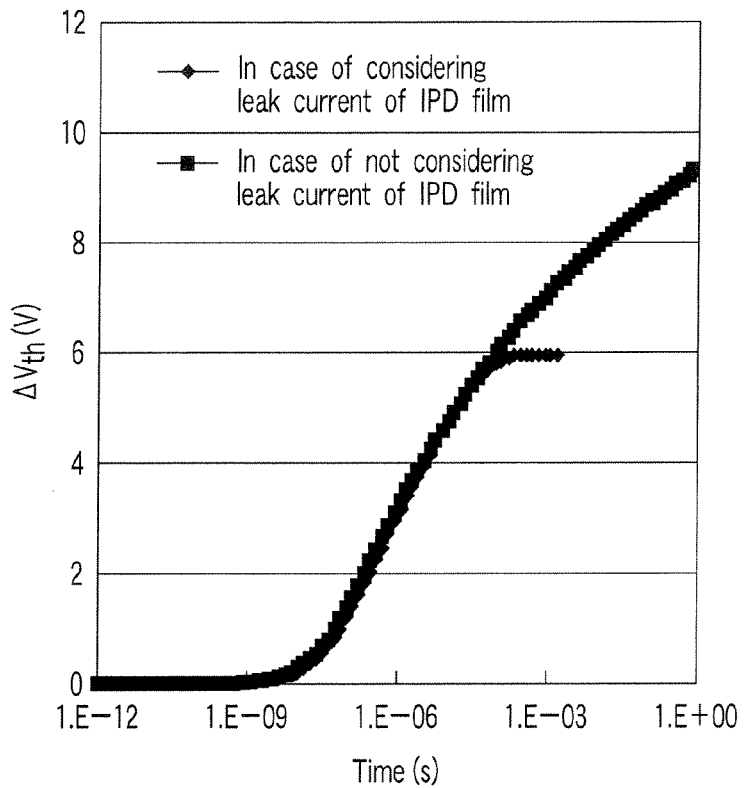
FIG. 13 is a view showing a calculation result of a change with time of a threshold voltage.

FIG. 13 shows a result of the calculation.

Although the figure comparatively shows a case (♦) in which an IPD leakage current is considered and a case (■) in which the current is not considered, when a leakage current is generated with an IPD, it is found that the threshold voltage does not change to be equal to or greater than a stable value.

This stable value assigns an indication of a memory cell programming capability.

Therefore, when the work function of the floating gate electrode has been variously changed, how a shift quantity ΔVth of the threshold voltage changes is checked.

Figure 14:
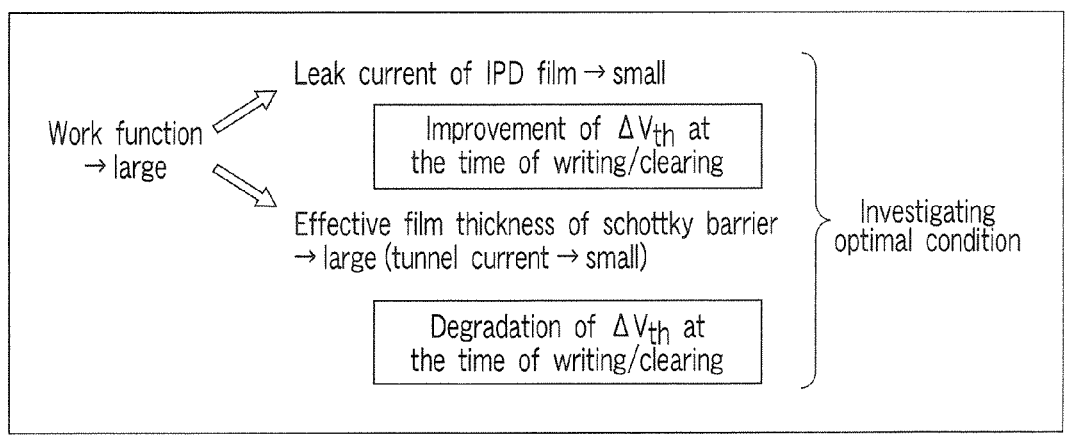
FIG. 14 is a view showing a process for obtaining an optimal condition of a change quantity of a threshold voltage.

As shown in FIG. 14, there are two factors for determining ΔVth, i.e., a leakage current and a Schottky barrier capacitance. With these two factors, there are attained advantageous effects that are reversal to each other, thus making it necessary to check an optimal condition.

Figure 15:
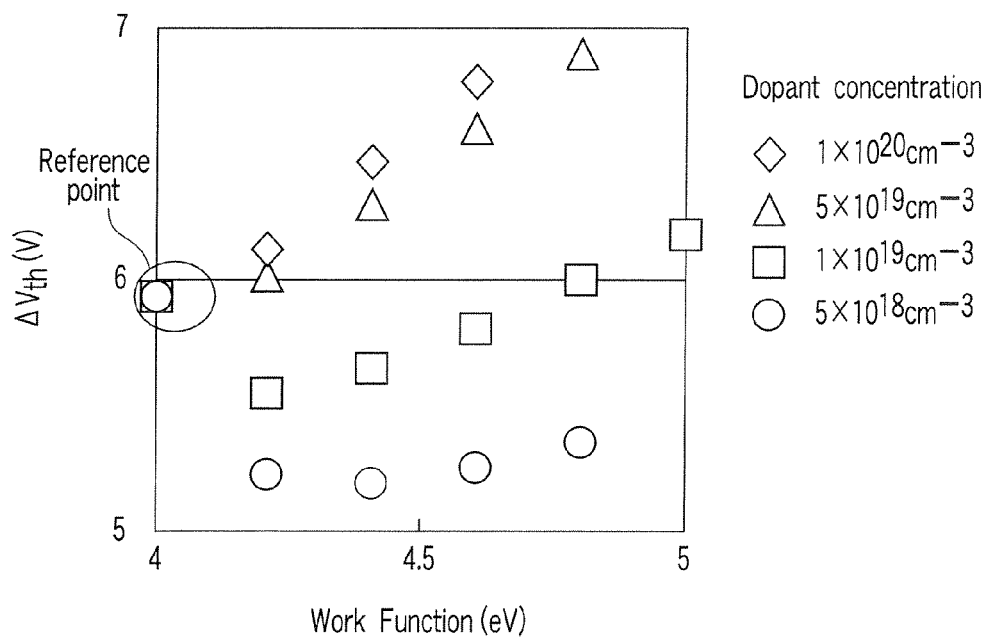
FIG. 15 is a view showing a simulation result of a change with time of a threshold voltage.

FIG. 15 shows a summary of a simulation result.

Here, a "reference point" of the threshold shift quantity ΔVth indicates n$^+$ type polysilicon in which a work function of a floating gate electrode is of 4.0 eV. In the case where a threshold shift quantity exceeding this reference point can be obtained, it is judged that the memory cell programming characteristics are improved.

The following matters can be found from this calculation result.

One is that whether or not the threshold shift quantity ΔVth exceeds the reference point greatly depends on the concentration of dopant (impurities) of polysilicon. If the concentration of dopant (impurities) is equal to or greater than $5 \times 10^{19}$ cm$^{-3}$, the shift quantity ΔVth of the threshold voltage is not lower than the reference point.

In addition, if the work function of the floating gate electrode is equal to or greater than 4.4 eV under that condition, the leakage current can be set to be equal to or smaller than the reference value, and the improvement of programming characteristics can be observed. Therefore, as a conclusion, with respect to the floating gate electrode, it is preferable that the concentration of dopant (impurities) of the electrically conductive semiconductor material at the tunnel insulation film side should be equal to or greater than $5\times10^{19}$ cm$^{-3}$ and that the work function of the metal at the IPD side should be equal to or greater than 4.4 eV.

Advantageous effects of the present invention are summarized as follows.

An electrically conductive material having a large work function is provided on an interface between a floating gate electrode and an IPD, thereby making it possible to restrict a phenomenon in which an electron is emitted from the floating gate electrode to the control gate electrode.

An electrically conductive material having a large work function is provided on an interface between a control gate electrode and an IPD, thereby making it possible to restrict a phenomenon in which an electron is injected from the control gate electrode to the floating gate electrode.

Therefore, a leakage current at the time of programming/erasing that is important in operation of a flash memory can be reduced.

In addition, if a work function of an interface between a floating gate electrode and a tunnel insulation film is maintained to be equal to or substantially equal to a work function of an interface between n$^+$ polysilicon and a silicon oxide film, a tunnel current at the time of erasing of a flash memory is not reduced.

Further, if a portion coming into contact with the tunnel insulation film of the floating gate electrode is made of a metal material, a depletion layer is not generated on a bottom face of the floating gate electrode, and then, the programming/erasing characteristics are improved.

If an IPD leakage current is decreased as described above, a window (difference) in threshold voltage between memory cells in a programmed state and an erased state can be increased. Thus, the multi-level operation of a flash memory can be achieved by utilizing this difference.

5. Embodiments (1) First Embodiment

Figure 16:
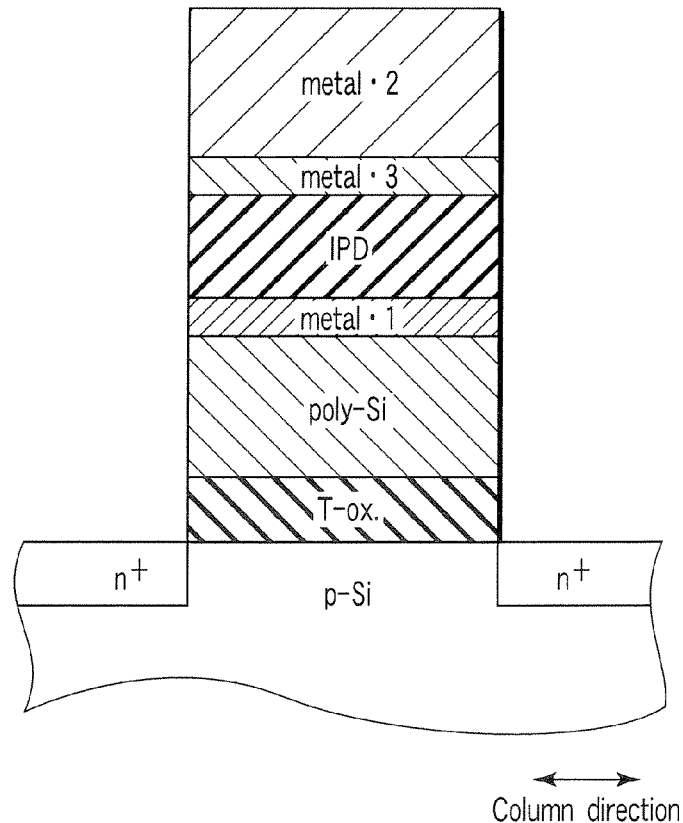
FIG. 16 is a sectional view showing a cell structure according to a first embodiment.

FIG. 16 shows a nonvolatile semiconductor memory device according to a first embodiment.

In order to prevent a leakage current from being generated with an IPD (for example, high dielectric (high-k) material), it is efficient to employ a structure of sandwiching the IPD between materials each having a large work function, for example, a metal (CG)/insulation element (high-k)/metal (FG) structure.

However, in order to ensure the reliability of the tunnel insulation film (gate insulation film) between a channel and a floating gate electrode, for example, it is necessary to employ a "polysilicon (FG)/insulation element (T-ox.)" structure using electrically conductive polysilicon that includes n-type impurities as a floating gate electrode.

Therefore, in the first embodiment, the floating gate electrode is formed as a stack structure made of electrically conductive polysilicon (poly-Si) coming into contact with a tunnel insulation film (T-ox.) and a metal (metal 1) coming into contact with an IPD (for example, material with high dielectric constant (high-k)).

This metal (metal 1) is selected from materials having a work function that is greater than a work function 4.0 eV of electrically conductive polysilicon (poly-Si), for example, electrically conductive polysilicon including n-type impurities. In addition, it is preferable that a work function of the metal (metal 1) should be 4.4 eV or more and 5.2 eV or less.

In addition, a metal structure is employed as a control gate electrode.

For example, with respect to the control gate electrode, a stack structure is formed of: a low resistance metal (metal 2) considering a wiring resistance; and a metal (metal 3) provided between an IPD and the low resistance metal (metal 2) and having a work function that is greater than a work function 4.0 eV of electrically conductive polysilicon including n-type impurities.

In addition, the metal (metal 3) may have a work function that is greater than that of the low resistance metal (metal 2).

In this manner, it is possible to make an attempt to obtain compatibility between an increase in coupling ratio β of memory cells having a floating gate electrode and a control gate electrode and reduction of a leakage current at the time of programming/erasing that occurs with an IPD (for example, material with high dielectric constant (high-k)).

If the metal (metal 3) and the metal (metal 1) are composed of the same material, a process is simplified, and a manufacturing cost can be reduced.

(2) Second Embodiment

Figure 17:
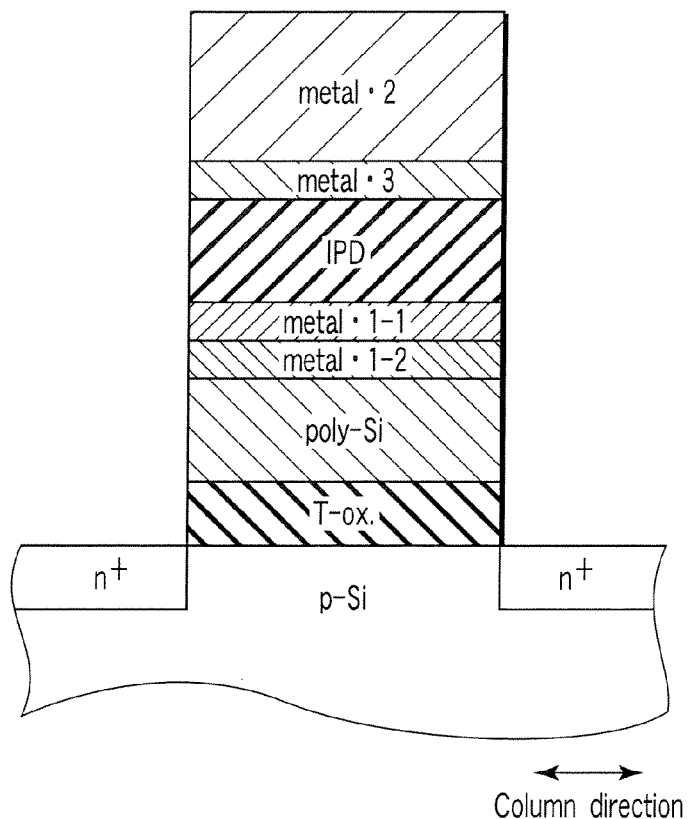
FIG. 17 is a sectional view showing a cell structure according to a second embodiment.

FIG. 17 shows a nonvolatile semiconductor memory device according to a second embodiment.

In the second embodiment, a floating gate electrode is formed as a stack structure made of: electrically conductive polysilicon (poly-Si) coming into contact with a tunnel insulation film (T-ox.); a metal (metal 1-1) coming into contact with an IPD (for example, material with high dielectric constant (high-k)); and a metal (metal 1-2) between the electrically conductive polysilicon (poly-Si) and the metal (metal 1-1).

The second embodiment is featured in that a metal provided between the electrically conductive polysilicon (poly-Si) and the IPD is made of a plurality of layers (two layers in example of FIG. 17).

Work functions of the metals (metal 1-1, metal 1-2) between the polysilicon (poly-Si) and the IPD is gradually increased from the electrically conductive polysilicon (poly-Si) toward the IPD. The work functions of these metals (metal 1-1, metal 1-2) are selected from those of materials each having a work function that is greater than a work function 4.0 eV of the electrically conductive polysilicon (poly-Si), for example, electrically conductive polysilicon including n-type impurities.

In addition, it is preferable that the work functions of the metals (metal 1-1, metal 1-2) should be 4.4 eV or more and 5.2 eV or less.

In this manner, a difference in work function between the electrically conductive polysilicon (poly-Si) and the metal (metal 1-2) is reduced; the lowering of the coupling ratio β caused by a Schottky barrier generated on an interface therebetween is prevented; and the memory cell characteristics are improved.

In addition, as in the first embodiment, a metal structure is employed as a control gate electrode.

For example, with respect to the control gate electrode, a stack structure is formed of: a low resistance metal (metal 2) considering a wiring resistance; and a metal (metal 3) provided between an IPD and the low resistance metal (metal 2) and having a work function that is greater than a work function 4.0 eV of electrically conductive polysilicon including n-type impurities.

In addition, the metal (metal 3) may have a work function that is greater than that of the low resistance metal (metal 2).

In this manner, it is possible to made an attempt to obtain compatibility between an increase in coupling ratio β of memory cells having a floating gate electrode and a control gate electrode and reduction of a leakage current at the time of programming/erasing that occurs with an IPD (for example, material with high dielectric constant (high-k)).

If the metal (metal 3) and the metal (metal 1-1) are composed of the same material, a process is simplified, and a manufacturing cost can be reduced.

(3) Third Embodiment

Figure 18:
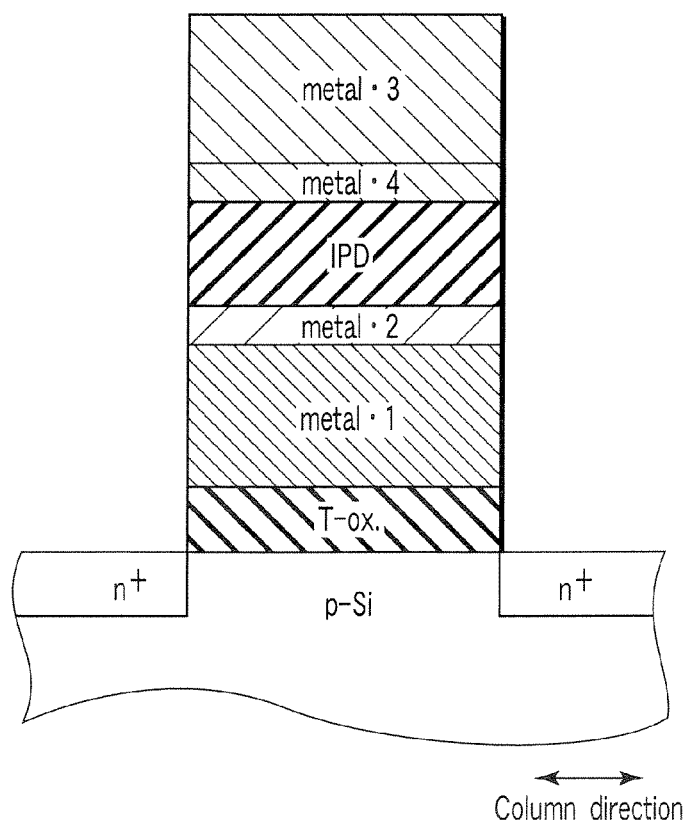
FIG. 18 is a sectional view showing a cell structure according to a third embodiment.

FIG. 18 shows a nonvolatile semiconductor memory device according to a third embodiment.

In the third embodiment, a floating gate electrode is formed as a stack structure made of a metal (metal 1) coming into contact with a tunnel insulation film (T-ox.) and a metal (metal 2) coming into contact with an IPD (for example, material with high dielectric constant (high-k)).

A work function of the metal (metal 1) is set at a value equal to or greater than a work function of silicon, and a work function of the metal (metal 2) is set to be greater than a work function of the metal (metal 1).

The work functions of the metals (metal 1, metal 2) are selected from those of materials each having a work function that is greater than a work function 4.0 eV of electrically conductive polysilicon including n-type impurities, for example. In addition, it is preferable that the work functions of the metals (metal 1, metal 2) should be 4.4 eV or more and 5.2 eV or less.

In addition a metal structure is employed as a control gate electrode.

For example, with respect to the control gate electrode, a stack structure is made of: a low resistance metal (metal 3) considering a wiring resistance; and a metal (metal 4) provided between an IPD and the low resistance metal (metal 3) and having a work function that is greater than a work function of the metal (metal 1). In addition, the metal (metal 4) may have a work function that is greater than that of the low resistance metal (metal 3).

In this manner, it is possible to make an attempt to obtain compatibility between an increase in coupling ratio β of memory cells having a floating gate electrode and a control gate electrode and reduction of a leakage current at the time of programming/erasing that occurs with an IPD (for example, material with high dielectric constant (high-k)).

In addition, because the floating gate electrode is composed of only metal, there does not occur a depletion layer that becomes a problem in the case where the floating gate electrode is made of electrically conductive polysilicon. Thus, the memory cell characteristics can be improved.

If the metal (metal 4) and the metal (metal 2) are composed of the same material, a process is simplified, and then, a manufacturing cost can be reduced.

(4) Fourth Embodiment

Figure 19:
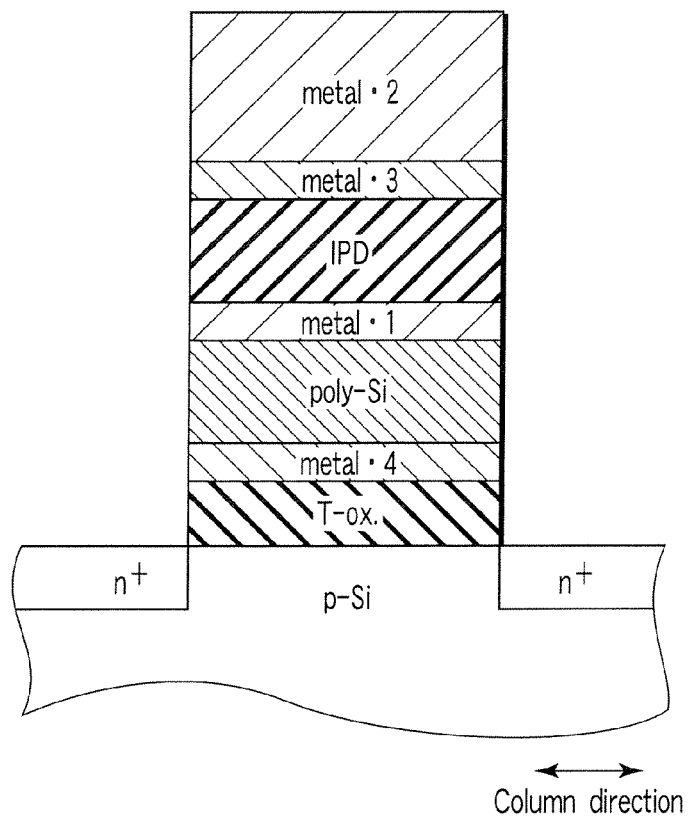
FIG. 19 is a sectional view showing a cell structure according to a fourth embodiment.

FIG. 19 shows a nonvolatile semiconductor memory device according to a fourth embodiment.

The fourth embodiment is an application example of the first embodiment.

The fourth embodiment is featured in that a metal (metal 4) is provided between a tunnel insulation film (T-ox.) and electrically conductive polysilicon (poly-Si). The other constituent elements are identical to those according to the first embodiment.

The metal (metal 4) prevents characteristic degradation of memory cells caused by the presence of a depletion layer generated with electrically conductive polysilicon (poly-Si).

A work function of the metal (metal 4) is not limited in particular. For example, the metal (metal 4) may have a work function that is greater than a work function 4.0 eV of electrically conductive polysilicon (poly-Si), for example, electrically conductive polysilicon including n-type impurities.

With such a structure as well, it is possible to make an attempt to obtain compatibility between an increase in coupling ratio β of memory cells and reduction of a leakage current at the time of programming/erasing that occurs with an IPD (for example, material with high dielectric constant (high-k)).

(5) Fifth Embodiment

Figure 20:
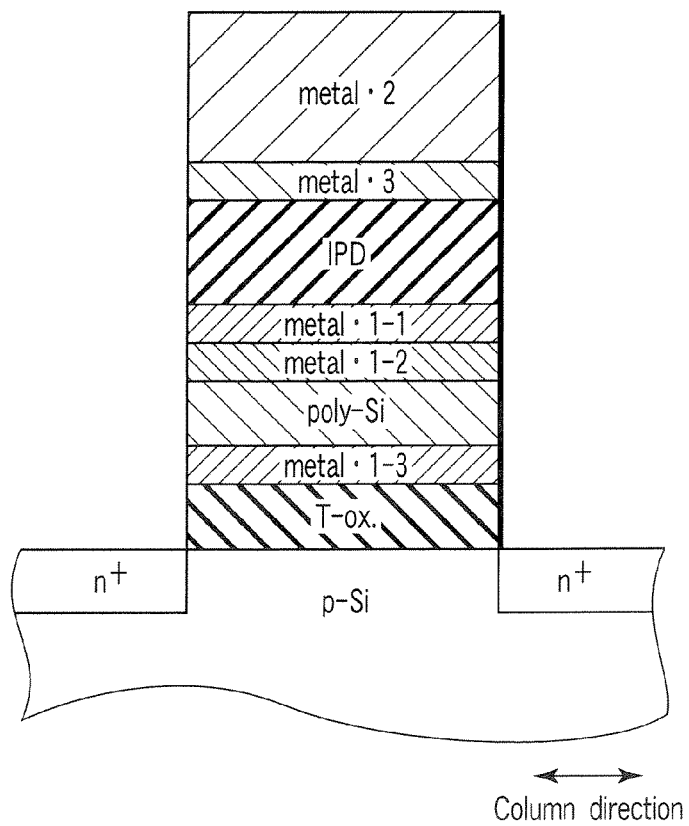
FIG. 20 is a sectional view showing a cell structure according to a fifth embodiment.

FIG. 20 shows a nonvolatile semiconductor memory device according to a fifth embodiment.

The fifth embodiment is an application example of the second embodiment.

The fifth embodiment is featured in that a metal (metal 1-3) is provided between a tunnel insulation film (T-ox.) and electrically conductive polysilicon (poly-Si). The other constituent elements are identical to those according to the second embodiment.

The metal (metal 1-3) prevents characteristic degradation of memory cells caused by the presence of a depletion layer generated with electrically conductive polysilicon (poly-Si).

A work function of the metal (metal 1-3) is not limited in particular. For example, the metal (metal 1-3) may have a work function that is greater than a work function 4.0 eV of electrically conductive polysilicon (poly-Si), for example, electrically conductive polysilicon including n-type impurities.

With such a structure as well, it is possible to make an attempt to obtain compatibility between an increase in coupling ratio β of memory cells and reduction of a leakage current at the time of programming/erasing that occurs with an IPD (for example, material with high dielectric constant (high-k)).

(6) Others

An example of the present invention is not limited to the shapes of a floating gate electrode and a control gate electrode of a memory cell.

Figure 21:
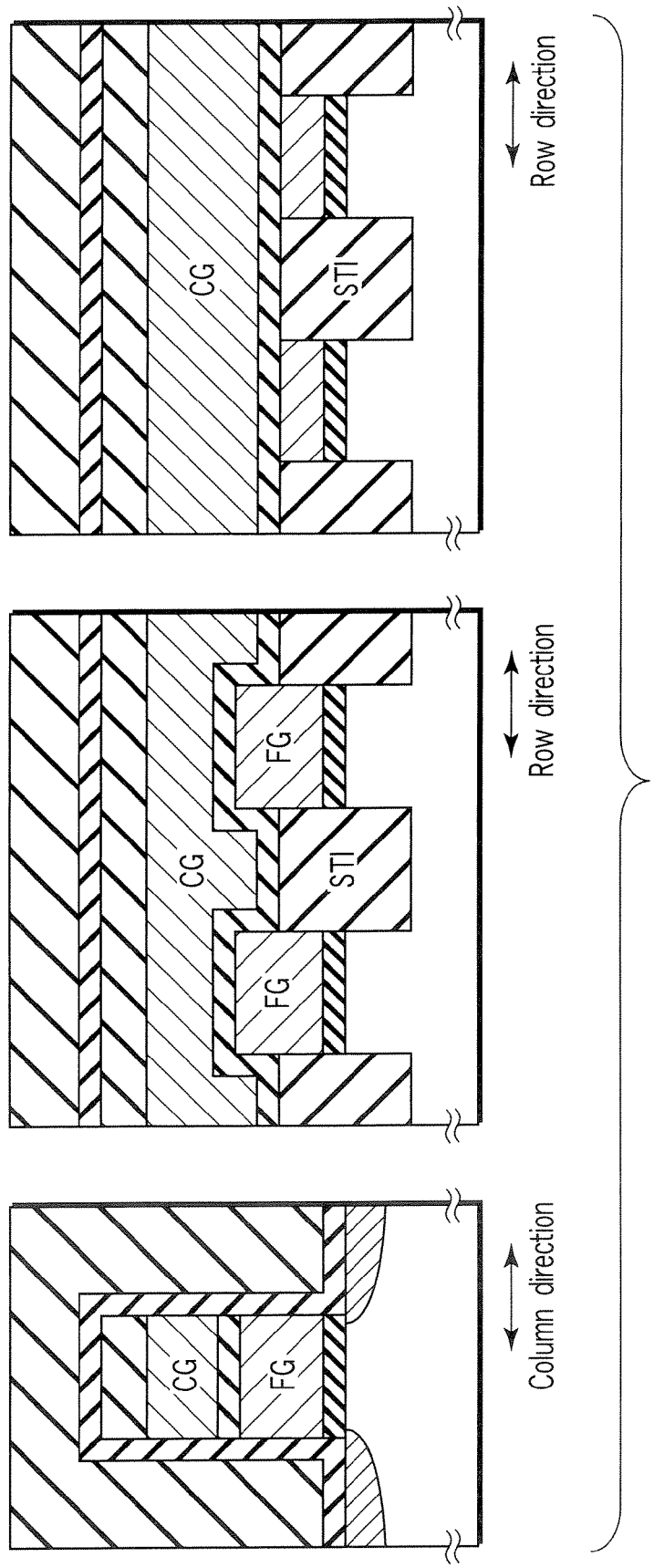
FIG. 21 is a sectional view showing a modified example of a cell structure.

For example, as shown in FIG. 21B, there may be provided a structure in which a floating gate electrode FG protrudes from an element separation insulation layer STI and a control gate electrode CG covers part of a side face of the floating gate electrode FG.

An end of the floating gate electrode FG may be formed in a gull wing shape that exists on the element separation insulation layer STI.

In addition, as shown in FIG. 21C, there may be provided a structure in which a top face of the floating gate electrode FG and a top face of the element separation insulation layer STI are substantially coincident with each other.

The sectional shape in a column direction shown in FIG. 21A is common to the structures shown in FIGS. 21B and 21C.

Polysilicon (poly-Si) configuring the floating gate electrode may be replaced with a material including a metal such as TaSiN.

6. Material Example

In a nonvolatile semiconductor memory device according to an example of the present invention, a floating gate electrode on a tunnel insulation film is composed of a plurality of first electrically conductive layers.

A bottom layer of the plurality of first electrically conductive layers (layer coming into contact with tunnel insulation film) is composed of a material including one or more kinds of elements selected from Si, Ta, Hf, Zr, Al, and Ti, or nitride, carbide, silicide, silicon nitride, or silicon carbon nitride of such a material.

For example, the bottom layer of the plurality of first electrically conductive layers is composed of Si, Hf, Zr, Al, Ti, Ta, TaSix, TaC, TaN, TiN, TaSiN, HfSix, HfSiN or the like.

In the case where the bottom layer of the plurality of first electrically conductive layers is made of silicide, the composition of silicide is that atom number of Si is equal to or greater than that of a metal.

In the case where the bottom layer of the plurality of first electrically conductive layers is composed of silicon-rich silicide MSix, $x \geqq 1$ is established, wherein M denotes a metal.

A top layer of the plurality of first electrically conductive layers (layer coming into contact with IPD) is composed of: a material including one or more kinds of elements selected from Pt, W, Ir, Ru, Re, Mo, Ti, Ta, Ni, and Co; silicide of a material including one or more kinds of elements selected from Pt, W, Ti, Ta, Ni, and Co; carbide of a material including one or more kinds of elements selected from W, Ti, and Ta; nitride of a material including one or more kinds of elements selected from W, Mo, Ti, and Ta; silicon nitride of a material including Ti; oxide of a material including one or more kinds of elements selected from Ir, and Ru; or a compound or mixture thereof.

For example, the top layer of the plurality of first electrically conductive layers is composed of Pt, W, Ir, $IrO_2$, Ru, $ReO_2$, Re, TaC, TaN, Mo, MoNx, MoSix, TiN, TiC, TiSiN, TiCN, NixSi, PtSix, WC, WN, WSix, or the like.

In the case where the top layer of the plurality of first electrically conductive layers is made of silicide, the composition of silicide is that an atom number of a metal is equal to or greater than that of Si.

In the case where the top layer of the plurality of first electrically conductive layers is composed of metal-rich silicide MSix, $x \leqq 1$ is established, wherein M denotes a metal.

In the case of a control gate electrode or in the case where the control gate electrode is composed of a plurality of second electrically conductive layers, its bottom layer can be composed of: a material including one or more kinds of elements selected from Pt, W, Ir, Ru, Re, Mo, Ti, Ta, Ni, and Co; silicide of a material including one or more kinds of elements selected from Pt, W, Ti, Ta, Ni, and Co; carbide of a material including one or more kinds of elements selected from W, Ti, and Ta; nitride of a material including one or more kinds of elements selected from W, Mo, Ti, and Ta; silicon nitride of a material including Ti; oxide of a material including one or more kinds of elements selected from Ir, and Ru; or a compound or mixture thereof.

For example, the bottom layer of the plurality of second electrically conductive layers is composed of Pt, W, Ir, $IrO_2$, Ru, $ReO_2$, Re, TaC, TaN, Mo, MoNx, MoSix, TiN, TiC, TiSiN, TiCN, NixSi, PtSix, WC, WN, WSix, or the like.

In the case where the bottom layer of the plurality of second electrically conductive layers is made of silicide, the composition of silicide is that an atom number of a metal is equal to or greater than that of Si.

In the case where the bottom layer of the plurality of second electrically conductive layers is composed of metal-rich silicide MSix, $x \leqq 1$ is established, wherein M denotes a metal.

An IPD is obtained as oxide, nitride or oxynitride of a material including at least one element selected from Al, Hf, La, Y, Ce, Ti, Zr, and Si.

IPD is useful if it is made of high-permittivity (high-k) material or is a multi-layer structure containing high-permittivity (high-k) material. Thus, IPD may be made of, for example, silicon oxide, silicon nitride, silicon oxinitride, or may be structure composed of layers made of these materials.

It is likable that the IPD comprises three or more layers, when the IPD is made of high-permittivity material. In this case, the layer which does not contact with both of the floating gate electrode and the control gate electrode is made of oxide, nitride, or oxynitride of a material including at least one element selected from Al, Hf, La, Y, Ce, Ti, Zr, and Si.

Because a degradation of retention appear based on capture and release of carriers, when the IPD is made of high-permittivity material. The retention is improved, when the high-permittivity material is sandwiched between insulating films, for example, an oxide, a nitride.

IN particular, IPD comprises $SiO_2$/material with high dielectric constant/$SiO_2$, SiON/material with high dielectric constant/SiON, $Si_3N_4$/$SiO_2$/material with high dielectric constant/$SiO_2$/$Si_3N_4$ or $Si_3N_4$/SiON/material with high dielectric constant/SiON/$Si_3N_4$.

TaC and TaN can have their work function changed over a broad range, depending on the method of producing them. This is why they are exemplified as materials for both the top and bottom layers of the floating gate.

7. Testing Examples (1) First Testing Example

Figure 22:
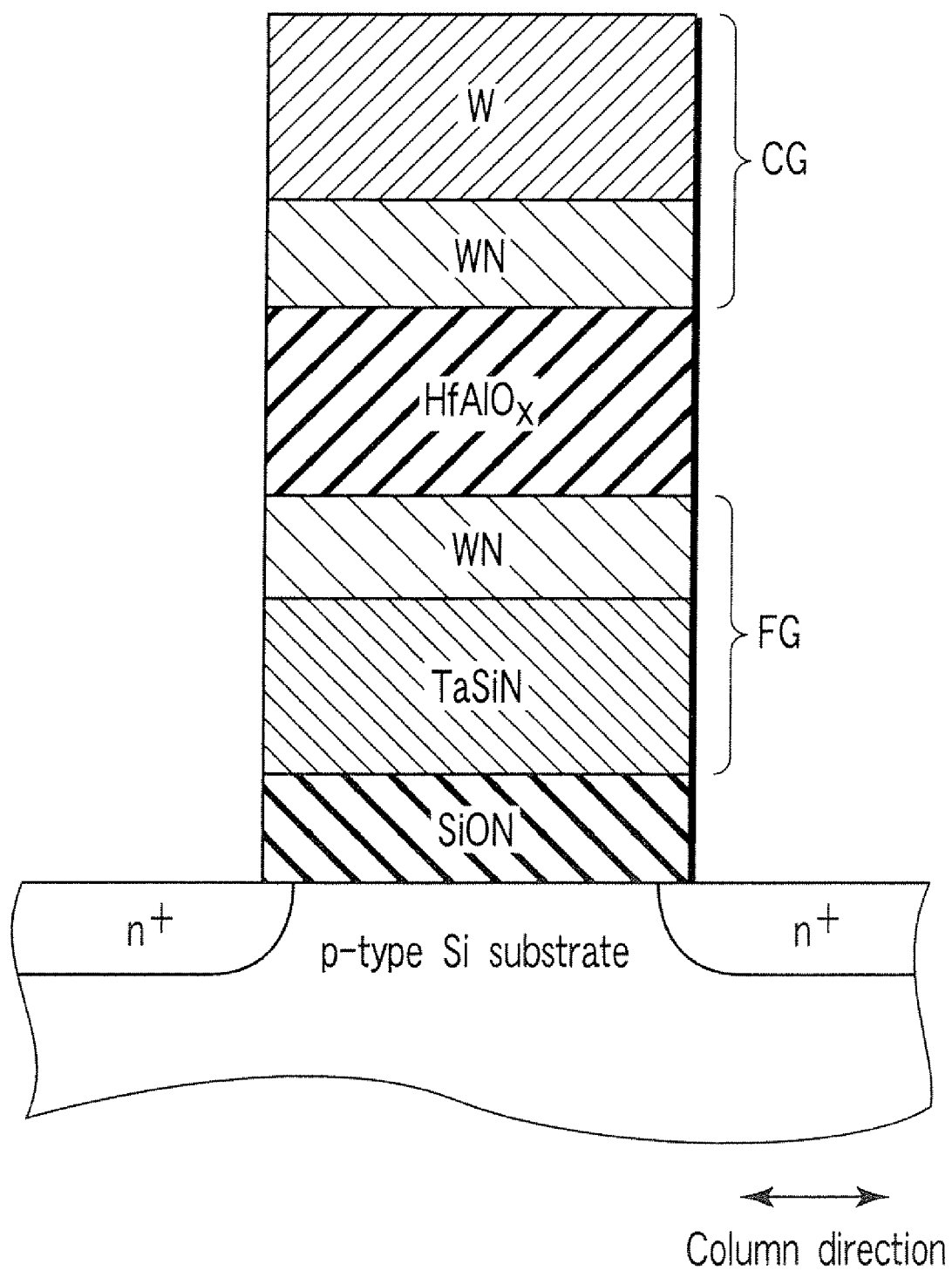
FIG. 22 is a sectional view showing a cell structure according to a first testing example.

FIG. 22 shows a structure of a memory cell according to a first testing example.

A silicon oxynitride film (SiON) serving as a tunnel insulation film (gate insulation film) is formed on a p-type silicon substrate. TaSiN is formed as an electrically conductive semiconductor material on the silicon oxynitride film. WN is formed as a metal material on TaSiN. A floating gate electrode FG is composed of a laminate of TaSiN and WN.

A material with high dielectric constant (high-k), HfAlOx (constitution: Hf/(Hf+Al)=0.6) is formed as an IPD on the floating gate electrode FG. A control gate electrode CG made of a laminate of WN and W is formed on HfAlOx.

Here, the thickness of SiON is set at a value ranging from about 7 nm to 8 nm, and the thickness of each of TaSiN and WN is set at a value ranging from about 30 nm to 60 nm. The thickness of HfAlOx is set at a value ranging from about 20 nm to 30 nm, for example.

Here, it must be noted that a total thickness of materials configuring the floating gate electrode FG is limited by the size of a cell transistor. That is, in order to restrict mutual interference between cells, it is necessary that a total thickness of materials configuring the floating gate electrode FG is smaller than any of the width and length of the cell transistor.

In addition, with respect to a work function, TaSiN is about 4.0 eV; WN is in the range of about 4.8 eV to 4.9 eV; and W is about 4.5 eV. A resistance rate of W is smaller than that of WN.

In the present example, although a layer coming into contact with a tunnel insulation film among two layers configuring the floating gate electrode FG has been composed of TaSiN, there can be used a metal gate material suitable for an n-channel MIS transistor such as TaN, TiN, W, and WSi or a metal material having a work function proximal to a center of an Si exclusive zone.

In addition, although WN has been used as a metal material coming into contact with an IPD, there can be used a metal gate material suitable for a p-channel MIS transistor such as Ru, TaC or a material having a work function that is greater than that of a center part of an Si exclusive zone from among elements such as Au, Pt, Co, Ni, Pd, Te, Mo, Ir, Hf, Zr, Y, and La or their compounds.

In addition, in the present example, hafnium aluminate has been used as a material with high dielectric constant (high-k). However, in this case, if its constitution (Hf/(Hf+Al)) is set at a value ranging from about 0.3 to 0.8, good leakage current characteristics and material processing properties can be obtained.

As a material with high dielectric constant, in addition to HfAlOx, there can be used oxide, oxynitride, silicon oxide or the like including at least one or more elements selected from Al, Hf, La, Y, Ce, Ti, Zr, and Si, and further, there can be used a laminate of such materials.

As an IPD, a material with high dielectric constant and an insulation film such as a silicon oxide film or a silicon nitride film can be used in combination with each other. For example, the IPD can be composed of a stack structure such as $Si_3N_4$/$SiO_2$/material with high dielectric constant/$SiO_2$/$Si_3N_4$ or $Si_3N_4$/SiON/material with high dielectric constant/SiON/$Si_3N_4$. In addition, an interface layer made of a very thin insulation material may exist on each one of an interface between the IPD and the floating gate electrode FG and an interface between the IPD and a control gate electrode CG.

As a tunnel insulation film, in addition to a silicon oxynitride film (SiON), there may be used a stack structure such as $SiO_2$/$Si_3N_4$/$SiO_2$ or $Si_2N_4$/$SiO_2$/$Si_2N_4$, and further, there may be used a stack structure made of a material with high dielectric constant and a silicon insulation film.

With respect to a method for manufacturing a memory cell shown in FIG. 22, the manufacturing method described in FIGS. 2 to 6 can be basically applied as it is.

Now, a description will be given here with only the steps that are different from those shown in FIGS. 2 to 6.

An ALD technique is used with respect to forming a floating gate electrode FG.

First, TaSiN serving as a lower layer of the floating gate electrode FG is formed using the ALD technique in which $Ta[N(CH_3)_2]_5$, $NH_3$, and $SiH_4$ are used as raw material gases. Then, WN serving as an upper layer of the floating gate electrode FG is formed using the ALD technique in which $WF_6$ and $NH_3$ are used as raw material gases.

Next, HfAlOx is formed in an atmosphere at a temperature of 250° C. using the ALD technique in which $Al(CH_3)_3$, $Hf[N(CH_3)_2]_4$, and $H_2O$ are used as raw material gases. Then, annealing is carried out in an atmosphere in which 850° C., $O_2$, and 130 Pa are set.

With respect to forming a control gate electrode CG, two methods, the ALD technique and the CVD technique, are used.

First, WN serving as a lower layer of the control gate electrode CG is formed using the ALD technique in which $WF_6$ and $NH_3$ are used as raw material gases. Then, W serving as an upper layer of the control gate electrode CG is formed using the CVD technique in which $W(CO)_6$ is used as a raw material gas.

The manufacturing method shown here is provided as a mere example, and the memory cell shown in FIG. 22 may be formed in accordance with another manufacturing method.

For example, with respect to the raw material gas for use in the ALD technique, another gas can be used, and no particular limitation applies to the use of the ALD technique and the CVD technique.

In addition, it is possible to form the floating gate electrode FG, the control gate electrode CG, and the IPD by using a sputtering technique, a vapor deposition technique, a laser abrasion technique, or an MBE technique solely or in combination.

(2) Second Testing Example

Figure 23:
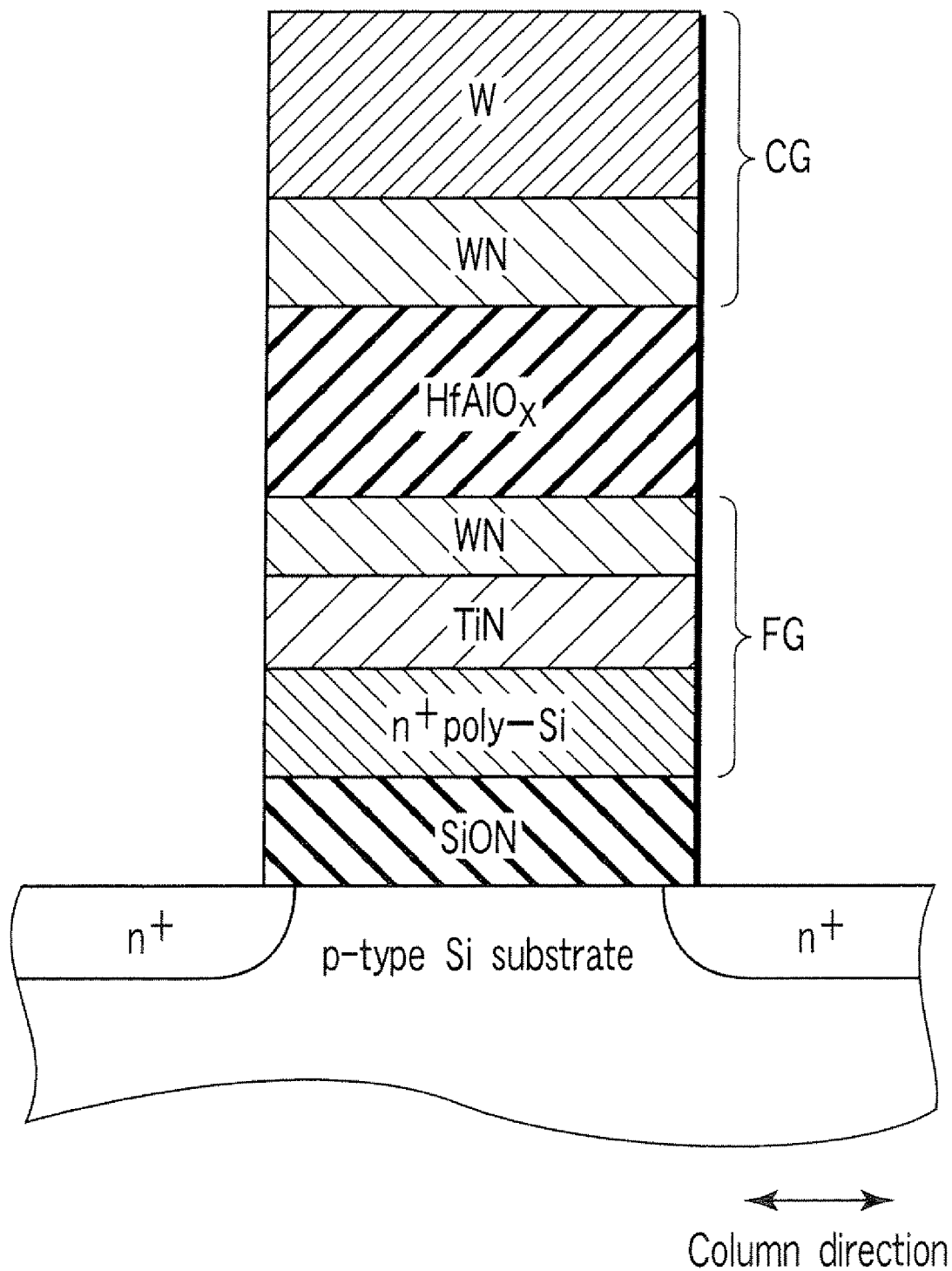
FIG. 23 is a sectional view showing a cell structure according to a second testing example.

FIG. 23 shows a structure of a memory cell according to a second testing example.

A silicon oxynitride film (SiON) serving as a tunnel insulation film (gate insulation film) is formed on a p-type silicon substrate. Polysilicon ($n^+$ poly-Si) including n-type impurities is formed as an electrically conductive semiconductor material on the silicon oxynitride film. Metal materials, for example, TiN and WN are formed on the $n^+$ poly-Si. A floating gate electrode FG is composed of a laminate of $n^+$ poly-Si, TiN, and WN.

HfAlOx (constitution: Hf/(Hf+Al)=0.6) is formed as a material with high dielectric constant (high-k) on the floating gate electrode FG. HfAlOx functions as an IPD. A control gate electrode CG made of a laminate of WN and W is formed on the HfAlOx.

Here, the thickness of SiON is set at a value ranging from 7 nm to 8 nm, for example, the thickness of $n^+$ poly-Si is set at about 30 nm, for example, and the thickness of each of TiN and WN is set at a value ranging from about 20 nm to 30 nm. The thickness of HfAlOx is set at a value ranging from about 20 nm to 30 nm, for example.

In addition, with respect to a work function, $n^+$ poly-Si is about 4.0 eV; TiN is about 4.6 eV; WN is in the range of about 4.8 eV to 4.9 eV; and W is about 4.5 eV. A resistance rate of W is smaller than that of WN.

In the present example, although a lower layer of a metal material contained in the floating gate electrode FG has been composed of TiN, there can be also used a material having a work function proximal to a center of a Si exclusive zone such as TaN and having barrier properties relevant to diffusion of atoms, a metal gate material suitable for an n-channel MIS transistor having a work function that is smaller than that proximal to the center of the Si exclusive zone or the like.

In addition, although WN has been used as a metal material coming into contact with an IPD, there can be also used a metal gate material suitable for a p-channel MIS transistor such as Ru or TaC or a material having a work function that is greater than that at the center part of the Si exclusive zone among elements such as Au, Pt, Co, Ni, Pd, Te, Mo, Ir, Hf, Zr, Y, and La or compounds thereof.

In addition, in the present example, hafnium aluminate has been used as a material with high dielectric constant (high-k). However, in this case, when its constitution (Hf/(Hf+Ai) is set at a value ranging from about 0.3 to 0.8, good leakage current characteristics and material processing properties can be obtained.

As a material with high dielectric constant, in addition to HfAlOx, there can be used oxide, oxynitride, or silicon oxide including at least one or more elements selected from Al, Hf, La, Y, Ce, Ti, Zr, and Si, and further, there can be used a laminate of such materials.

As an IPD, a material with high dielectric constant and a silicon insulation film can be used in combination with each other. In addition, an interface layer made of a very thin insulation material may exist on each one of an interface between the IPD and the floating gate electrode FG and an interface between the IPD and the control gate electrode CG.

With respect to a method for manufacturing a memory cell shown in FIG. 23, the manufacturing method described in FIGS. 2 to 6 can be basically applied as it is.

Now, a description will be given with respect to the steps that are different from those shown in FIGS. 2 to 6.

A CVD technique is used for forming a floating gate electrode FG.

First, phosphorus (P)-doped $n^+$ poly-Si serving as a lower layer of the floating gate electrode FG is formed in an atmosphere at a temperature of 620° C. by using a CVD technique.

Then, TiN provided at the side of $n^+$ poly-Si serving as a metal material is formed in an atmosphere at a temperature of 500° C. by using a CVD technique in which $TiCl_4$ and $NH_3$ are used as raw material gases. Subsequently, WN provided at the side of HfAlOx serving as a metal material is formed in an atmosphere at a temperature of about 450° C. by using a CVD technique in which $W(CO)_6$ and $NH_3$ are used as raw material gases.

Next, HhfAlOx is formed in an atmosphere at a temperature of 250° C. by using an ALD technique in which $Al(CH_3)_3$, $Hf[N(CH_3)_2]_4$, and $H_2O$ are used as raw material gases. Then, annealing is carried out at an atmosphere in which 850° C., $O_2$, and 130 Pa are set.

A CVD technique is used with respect to forming a control gate electrode CG.

First, WN serving as a lower layer of the control gate electrode CG is formed on HfAlOx in an atmosphere at a temperature of 450° C. by using a CVD technique in which $W(CO)_6$ and $NH_3$ are used as raw material gases. Subsequently, W serving as an upper layer of the control gate electrode CG is formed on the WN in an atmosphere at a temperature of about 450° C. by using a CVD technique in which $W(CO)_6$ is used as a raw material gas.

The manufacturing method shown here is provided as a mere example, and the memory cell shown in FIG. 23 may be formed in accordance with another manufacturing method.

For example, another gas can be used as a raw material gas for use in a CVD technique, and an ALD technique may be used instead of the CVD technique.

In addition, it is possible to form the floating gate electrode FG, the control gate electrode CG, and the IPD by using a sputtering technique, a vapor deposition technique, a laser abrasion technique, and an MBE technique other than the CVD technique and the ALD technique solely or in combination.

(3) Third Testing Example

Figure 24:
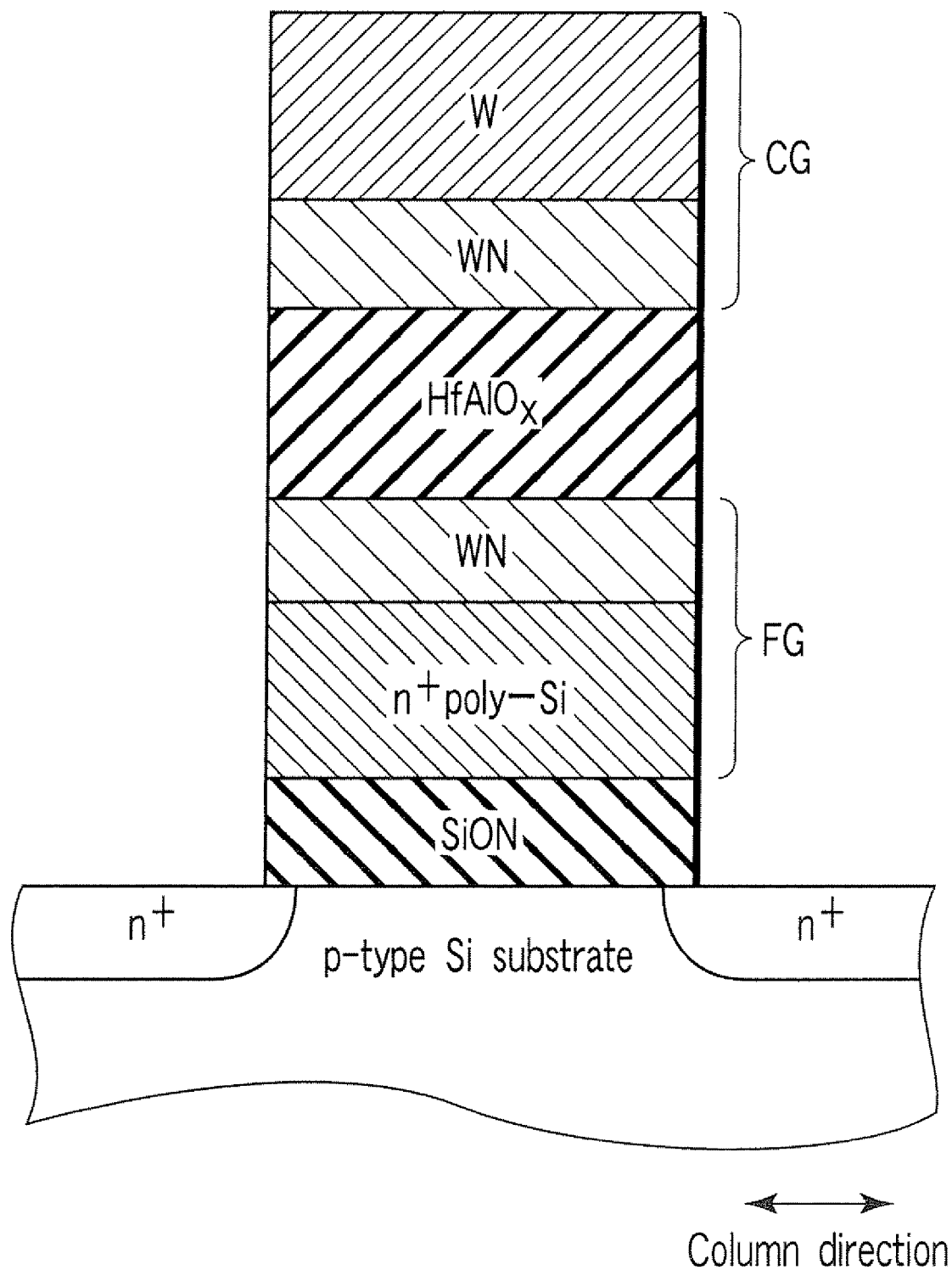
FIG. 24 is a sectional view showing a cell structure according to a third testing example.

FIG. 24 shows a structure of a memory cell according to a third testing example.

A silicon oxynitride film (SiON) serving as a tunnel insulation film (gate insulation film) is formed on a p-type silicon substrate. Polysilicon ($n^+$ poly-Si) including n-type impurities is formed as an electrically conductive semiconductor material on the silicon oxynitride film. WN is formed as a metal material on the $n^+$ poly-Si. A floating gate electrode FG is composed of a laminate of $n^+$ poly-Si and WN.

HfAlOx (composition: Hf/(Hf+Al)=0.6) is formed as a material with high dielectric constant (high-k) on the floating gate electrode FG. HfAlOx functions as an IPD. A control gate electrode CG made of a laminate of WN and W is formed on the HfAlOx.

Here, the thickness of SiON is set at a value ranging from 7 nm to 8 nm, for example, the thickness of $n^+$ poly-Si is set at about 60 nm, for example, and the thickness of WN is set at a value ranging from about 20 nm to 30 nm. The thickness of HfAlOx is set at a value ranging from about 20 nm to 30 nm, for example.

With respect to the film thickness of each of the material layers configuring the floating gate electrode, a layer coming into contact with a tunnel insulation layer is primarily provided as a layer for accumulating electric charges. Thus, it is preferable that the film thickness of this layer should not be smaller than that of another layer. In particular, as in the present example, in the case where the layer coming into contact with the tunnel insulation film is made of a semiconductor material, such consideration is required.

In addition, with respect to a work function, $n^+$ poly-Si is about 4.0 eV; WN is about 4.8 eV to 4.9 eV; and W is about 4.5 eV. A resistance rate of W is smaller than that of WN.

In the present example, although a metal material contained in the floating gate electrode FG has been composed of WN, there can be used a metal gate material suitable for a p-channel MIS transistor in which a work function of Ru, TaC or the like is close to about 5 eV or a metal material having a work function of about 4.4 eV or more, such as TiN (about 4.6 eV) or TaN (about 4.4 eV) having barrier properties relevant to diffusion of atoms.

The metal materials contained in the floating gate electrode FG may have a work function of about 4.4 eV or more. Thus, for example, there can be used a metal such as Au (about 5.1 eV), Pt (about 5.3 eV), Co (about 5.0 eV), Ni (about 5.0 eV), Pd (about 5.2 eV), Mo (about 4.9 eV), or W (about 4.5 eV), or a metal compound thereof having a work function of 4.4 eV or more.

In addition, in the present example, hafnium aluminate has been used as a material with high dielectric constant (high-k). However, in this case, when its constitution Hf/(Hf+Al) is set at a value ranging from about 0.3 to 0.8, good leakage current characteristics and material processing properties can be obtained.

As a material with high dielectric constant, in addition to HfAlOx, there can be used oxide, oxynitride, silicon oxide or the like including at least one or more elements selected from Al, Hf, La, Y, Ce, Ti, Zr, and Si, and further, there can be used a laminate of such materials.

As an IPD, a material with high dielectric constant and a silicon insulation film can be used in combination with each other. In addition, an interface layer made of a very thin insulation material may exist on each one of an interface between the IPD and the floating gate electrode FG and an interface between the IPD and a control gate electrode CG.

With respect to a method for manufacturing a memory cell shown in FIG. 24, the manufacturing method described in FIGS. 2 to 6 can be basically applied as it is.

Now, a description will be given here with respect to only the steps that are different from those shown in FIGS. 2 to 6.

First, phosphorus (P)-doped $n^+$ poly-Si serving as a lower layer of a floating gate electrode FG is formed in an atmosphere at a temperature of 620° C. by using a CVD technique. At this time, a ratio of silane and phosphine serving as raw material gases is adjusted so that the concentration of phosphorus contained in $n^+$ poly-Si becomes about $1 \times 10^{20}$ cm$^{-3}$.

As another method for depositing $n^+$ poly-Si, there can be also used a sequential technique. In this method, the film forming of non-doped polysilicon by using $SiH_4$ alone and the adsorption of phosphorus by using diluted $PH_3$ alone are alternately repeated, thereby making it possible to precisely control the dopant concentration and thickness of the floating gate electrode FG.

Then, WN is formed on $n^+$ poly-Si in an atmosphere at a temperature of about 450° C. by using a CVD technique in which $W(CO)_6$ and $NH_3$ are used as raw material gas.

Next, HfAlOx is formed in an atmosphere at a temperature of 250° C. by using an ALD technique in which $Al(CH_3)_3$, $Hf[N(CH_3)_2]_4$ and $H_2O$ are used as raw material gases. Then, annealing is carried out in an atmosphere in which 850° C., $O_2$, and 130 Pa are set.

Then, WN serving as a lower layer of a control gate electrode CG is formed on HfAlOx in an atmosphere at a temperature of about 450° C. by using a CVD technique in which $W(CO)_6$ and $NH_3$ are used as raw material gases. Subsequently, W serving as an upper layer of the control gate electrode CG is formed on the WN in an atmosphere at a temperature of about 450° C. by using a CVD technique in which $W(CO)_6$ is used as a raw material gas.

The manufacturing method shown here is provided as a mere example, and the memory cell shown in FIG. 24 may be formed in accordance with another manufacturing method.

(4) Fourth Testing Example

Figure 25:
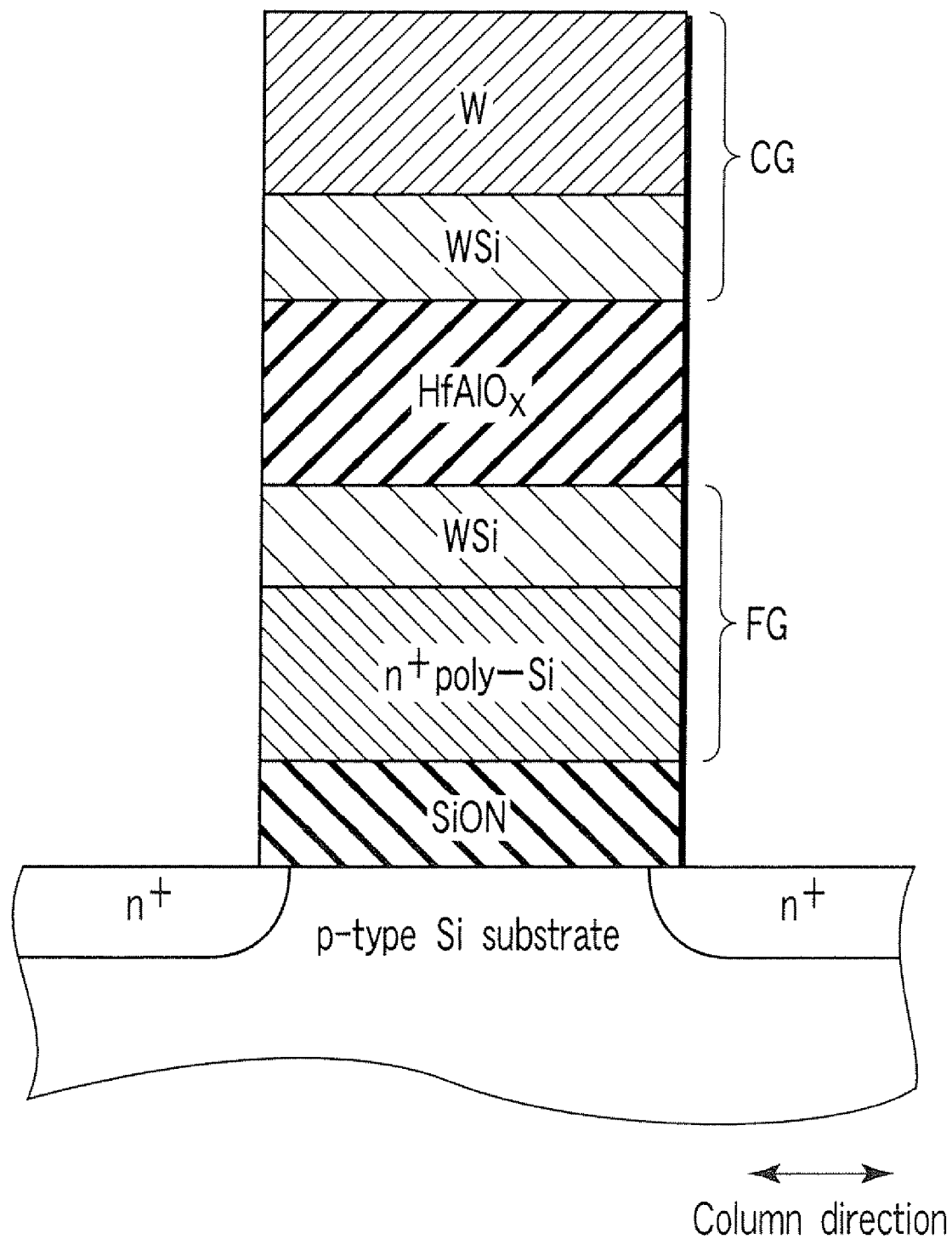
FIG. 25 is a sectional view showing a cell structure according to a fourth testing example.

FIG. 25 shows a structure of a memory cell according to a fourth testing example.

A silicon oxynitride film serving as a tunnel insulation film (gate insulation film) is formed on a p-type silicon substrate. Polysilicon ($n^+$ poly-Si) including n-type impurities is formed as an electrically conductive semiconductor material on the silicon oxynitride film. WSi is formed as a metal material on the $n^+$ poly-Si. A floating gate electrode FG is composed of a laminate of $n^+$ poly-Si and WSi.

A material with high dielectric constant (high-k), HfAlOx (constitution: Hf/(Hf+Al)=0.6) is formed as an IPD on the floating gate electrode FG. A control gate electrode CG made of a laminate of WSi and W is formed on the HfAlOx.

Here, the thickness of SiON is set at a value ranging from about 7 nm to 8 nm, for example, the thickness of $n^+$ poly-Si is set at about 60 nm, for example, and the thickness of WSi is set at 50 nm, for example. The thickness of HfAlOx is set at a value ranging from about 20 nm to 30 nm, for example.

In addition, with respect to a work function, $n^+$ poly-Si is about 4.0 eV; WSi is in the range of about 4.4 eV to 4.6 eV; and W is about 4.5 eV. A resistance rate of W is smaller than that of Wi.

In the present example, although the metal material contained in the floating gate electrode FG has been composed of WSi, another silicide material such as $CoSi_2$ or NiSi can be used considering heat resistance.

In addition, in the present example, hafnium aluminate has been used as a material with high dielectric constant (high-k). However, in this case, if its constitution (Hf/(Hf+Al)) is set at a value ranging from about 0.3 to 0.8, good leakage current characteristics and material processing properties can be obtained.

As a material with high dielectric constant, in addition to HfAlOx, there can be used oxide, oxynitride, silicon oxide or the like including at least one or more elements selected from Al, Hf, La, Y, Ce, Ti, Zr, and Si, and further, there can be used a laminate of such materials.

As an IPD, a material with high dielectric constant and a silicon insulation film can be used in combination with each other. In addition, an interface layer made of a very thin insulation material may exist on each one of an interface between the IPD and the floating gate electrode FG and an interface between the IPD and the control gate electrode CG.

With respect to a method for manufacturing a memory cell shown in FIG. 25, the manufacturing method described in FIGS. 2 to 6 can be basically applied as it is.

Now, a description will be given with respect to the steps that are different from those shown in FIGS. 2 to 6.

First, phosphorus (P)-doped $n^+$ poly-Si serving as a lower layer of a floating gate electrode FG is formed in an atmosphere at a temperature of about 620° C. by using a CVD technique.

Then, W is formed on the $n^+$ poly-Si by using a CVD technique in which $W(CO)_6$ is used as a raw material gas. Then, first annealing is carried out, W and Si are reacted with each other to form WSi serving as a quasi-stable phase, and unreacted W is removed in according with wet processing. Subsequently, second annealing is carried out, and the resultant product is changed to WSi serving as a stable phase.

Next, HfAlOx is formed in an atmosphere at a temperature of 250° C. by using an ALD technique in which $Al(CH_3)_3$, $Hf[N(CH_3)_2]_4$ and $H_2O$ are used as raw material gases. Then, annealing is carried out in an atmosphere in which 850° C., $O_2$, and 130 Pa are set.

Next, phosphorus (P)-doped $n^+$ poly-Si with thickness of about 50 nm is formed on HfAlOx in an atmosphere at a temperature of about 620° C. by using a CVD technique.

Then, W serving as a low resistance metal is formed to have sufficient thickness on $n^+$ poly-Si by using a CVD technique in which $W(CO)_6$ is used as a raw material gas. Then, first annealing is carried out, and W and Si are reacted with each other to form WSi serving as a quasi-stable phase. Subsequently, second annealing is carried out, and the resultant product is changed to WSi serving as a stable phase.

The manufacturing method shown here is provided as a mere example, and the memory cell shown in FIG. 25 may be formed in accordance with another manufacturing method.

For example, annealing for forming a silicide layer (WSi) may be integrated with annealing for activating a source/drain diffusion layer.

(5) Fifth Testing Example

Figure 26:
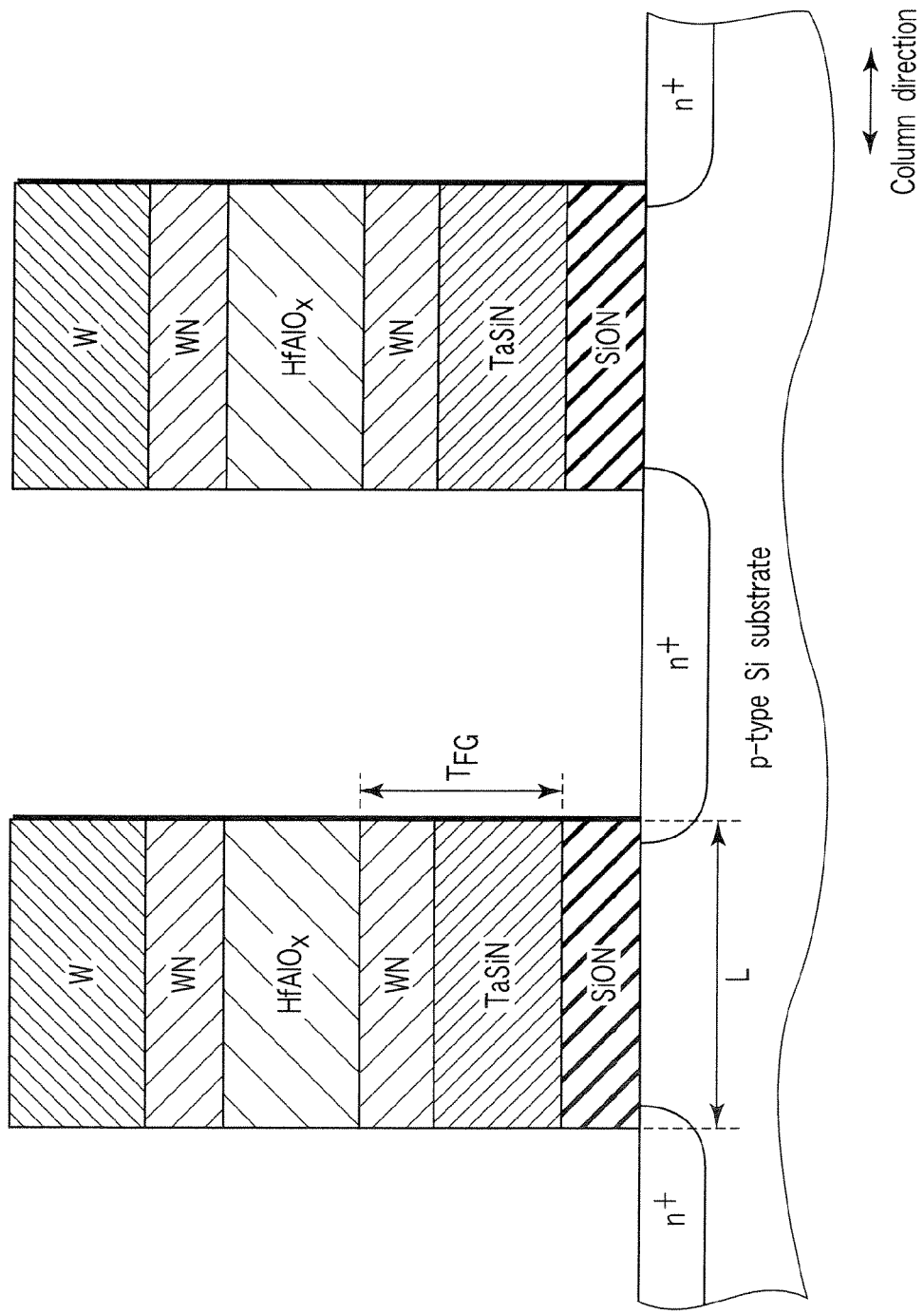
FIG. 26 is a sectional view showing a cell structure according to a fifth testing example.
Figure 27:
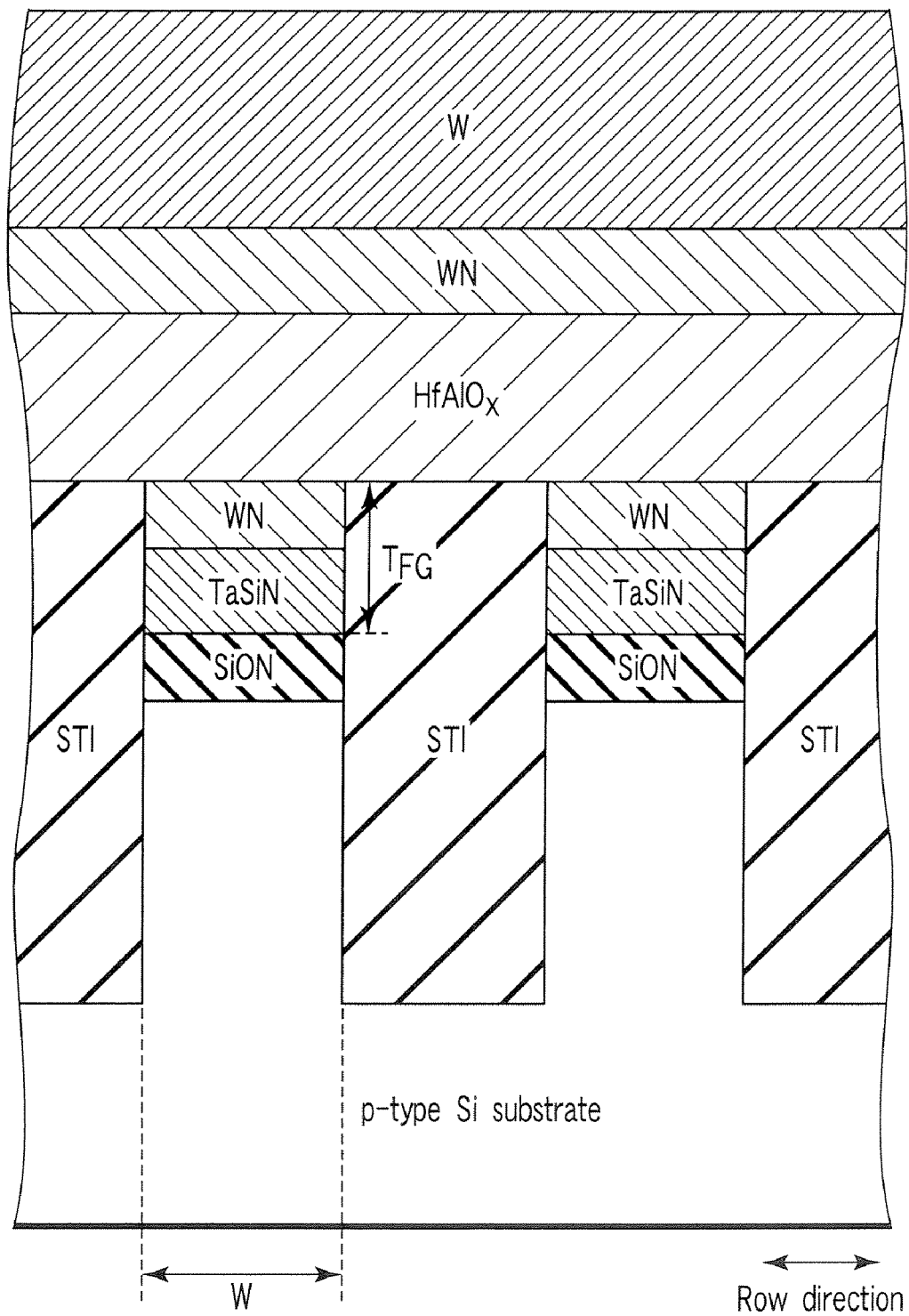
FIG. 27 is another sectional view showing a cell structure according to the fifth testing example.

FIGS. 26 and 27 each show a structure of a memory cell according to a fifth testing example.

The fifth testing example relates to a cell unit of a NAND type flash memory. Each of the memory cells contained in the cell unit has the same structure as that of each of the memory cells according to the first testing example.

This cell unit is featured in that, with respect to a column direction, the memory cells are connected in series, as shown in FIG. 26. In addition, this cell unit is featured in that, with respect to a row direction, a top face of a floating gate electrode and a top face of an element separation insulation layer (STI) substantially coincide with each other, on which a material with high dielectric constant (high-k), HfAlOx serving as an IPD is provided.

In the case of the NAND type flash memory, the downsizing of memory cells is remarkable. Thus, a structure of such a cell unit is provided as one of the techniques for obtaining a high coupling ratio while restricting a parasitic capacitance generated between the adjacent cells.

In addition, with respect to a floating gate electrode, in order to further reduce interference between the adjacent cells, it is preferable that $T_{FG}<L$ and $T_{FG}<W$ should be established in the case where the thickness, length, and width of the floating gate electrode are defined as $T_{FG}$, L, and W, respectively. This is because the thickness $T_{FG}$ of the floating gate electrode determines the size of the capacitor generated between the adjacent cells.

Further, in the memory cells of the NAND type flash memory, an electrically conductive layer (bottom layer) coming into contact with a tunnel insulation film primarily accumulates an electric charge from among a plurality of electrically conductive layers configuring the floating gate electrode.

Therefore, it is preferable that the bottom layer of a plurality of electrically conductive layers configuring the floating gate electrode should be the thickest among the plurality of these electrically conductive layers.

This condition is especially effective in the case where the electrically conductive layer (bottom layer) coming into contact with the tunnel insulation film is made of an electrically conductive semiconductor material.

8. Applied Example

An example of the present invention can be applied to a whole nonvolatile semiconductor memory device having memory cells of a stack gate structure.

For example, an example of the present invention is provided as a technique effective for NAND type, NOR type, AND type, DINOR type, and NANO type fused with advantages of NOR type and NAND type. Further, this technique is effective for 3Tr-NAND type or the like having a structure in which one memory cell is sandwiched between two selector transistors.

9. Conclusion

According to an example of the present invention, even if a material with high dielectric constant (high-k) is used as an IPD in order to increase a coupling ratio, a metal is provided as a material having a large work function between a floating gate electrode and the IPD and between a control gate electrode and the IPD, thus making it possible to reduce a leakage current that flows through the IPD at the time of programming/erasing.

In addition, reduction of a leakage current at the time of readout, improvement of data retention characteristics or the like can be achieved.

Further, with respect to a metal having a large work function, its work function is reduced in a stepwise manner to make it close to a work function of polysilicon, and then, the capacitance of a depletion layer generated in the floating gate electrode is restricted, thereby making it possible to prevent the lowering of the coupling ratio of memory cells caused by an electric potential fall due to the capacitance of the depletion layer.

As has been described above, according to an example of the present invention, even if memory cells are downsized, an increase of the coupling ratio and reduction of the leakage current can be achieved at the same time.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor device comprising: a source/drain diffusion layer provided in a semiconductor substrate; a first insulation film provided on a channel between the source/drain diffusion layers; a floating gate electrode provided on the first insulation film and composed of stacked first electrically conductive layers; a second insulation film provided on the floating gate electrode; and a control gate electrode provided on the second insulation film, wherein a bottom layer of the first electrically conductive layers is defined as a reference layer having a work function of 4.0 eV or more, and wherein a work function of each of the first electrically conductive layers increases gradually from the bottom layer toward a top layer of the first electrically conductive layers, wherein the reference layer is composed of an electrically conductive semiconductor material including impurities, and at least one first electrically conductive layer above the reference layer is composed of a metal.

2. The nonvolatile semiconductor device according to claim 1, wherein the impurities are n-type impurities, the electrically conductive semiconductor material is polysilicon, and dopant concentration of the n-type impurities is $5 \times 10^{19}$ cm$^{-3}$ or more.

3. The nonvolatile semiconductor device according to claim 1, wherein the reference layer and at least one first electrically conductive layer above the reference layer are composed of a metal.

4. The nonvolatile semiconductor device according to claim 1, wherein a bottom layer of the first electrically conductive layers is composed of an electrically conductive semiconductor material including impurities.

5. The nonvolatile semiconductor device according to claim 1, wherein work functions of the reference layer and at least one first electrically conductive layer above the reference layer are included in the range of 4.0 eV to 5.2 eV.

6. The nonvolatile semiconductor device according to claim 5, wherein a work function of at least one first electrically conductive layer above the reference layer is 4.4 eV or more.

7. The nonvolatile semiconductor device according to claim 1, wherein the control gate electrode is composed of an electrically conductive material having a work function that is greater than a work function of the reference layer.

8. The nonvolatile semiconductor device according to claim 1, wherein the control gate electrode is composed of a material that is the same as that for a top layer of the first electrically conductive layers.

9. The nonvolatile semiconductor device according to claim 1, wherein the control gate electrode is composed of stacked second electrically conductive layers and a bottom layer of the second electrically conductive layers is composed of an electrically conductive material having a work function that is greater than a work function of the reference layer.

10. The nonvolatile semiconductor device according to claim 9, wherein work functions of the second electrically conductive layers gradually increase as the layers are proximal to the second insulation layer.

11. The nonvolatile semiconductor device according to claim 9, wherein resistivities of the second electrically conductive layers gradually decreases as the layers are distant from the second insulation film.

12. The nonvolatile semiconductor device according to claim 9, wherein a bottom layer of the second electrically conductive layers is composed of a material that is the same as that for a top layer of the first electrically conductive layers.

13. The nonvolatile semiconductor device according to claim 1, wherein, in the case where thickness, length, and width of the floating gate electrode are defined as $T_{FG}$, L, and W, respectively, $T_{FG}<L$ and $T_{FG}<W$ are established.

14. The nonvolatile semiconductor device according to claim 1, wherein a bottom layer of the first electrically conductive layers is the thickest among the first electrically conductive layers.

15. The nonvolatile semiconductor device according to claim 1, wherein a bottom layer of the first electrically conductive layers is composed of a material including one or more kinds of elements selected from Si, Ta, Hf, Zr, Al, and Ti, or nitride, carbide, silicide, silicon nitride, or silicon carbon nitride of the material.

16. The nonvolatile semiconductor device according to claim 15, wherein, in the case where the bottom layer of the first electrically conductive layers is silicide, a constitution of the silicide is such that atom number of Si is equal to or greater than atom number of a metal.

17. The nonvolatile semiconductor device according to claim 1, wherein a top layer of the first electrically conductive layers is composed of: a material including one or more kinds of elements selected from Pt, W, Ir, Ru, Re, Mo, Ti, Ta, Ni, and Co; silicide of a material including one or more kinds of elements selected from Pt, W, Ti, Ta, Ni, and Co; carbide of a material including at least one or more kinds of elements selected from W, Ti, and Ta; nitride of a material including one or more kinds of elements selected from W, Mo, Ti, and Ta; silicon nitride of a material including Ti, oxide of a material including one or more kinds of elements selected from Ir, and Ru; or a compound or a mixture thereof.

18. The nonvolatile semiconductor device according to claim 17, wherein, in the case where a top layer of the first electrically conductive layers is silicide, a constitution of the silicide is such that atom number of a metal is equal to or greater than atom number of Si.

19. The nonvolatile semiconductor device according to claim 1, wherein the second insulation film is made of oxide, nitride, or oxynitride of a material including at least one element selected from Al, Hf, La, Y, Ce, Ti, Zr, and Si.

20. The nonvolatile semiconductor device according to claim 1, wherein the second insulation film comprises three or more layers, the layer which does not contact with both of the floating gate electrode and the control gate electrode is made of oxide, nitride, or oxynitride of a material including at least one element selected from Al, Hf, La, Y, Ce, Ti, Zr, and Si.

* * * * *